US012796320B2

(12) United States Patent
Zhang et al.

(10) Patent No.: US 12,796,320 B2
(45) Date of Patent: Nov. 10, 2026

(54) LIGHT-EMITTING DEVICE, LIGHT-EMITTING SUBSTRATE, AND LIGHT-EMITTING APPARATUS

(71) Applicant: BOE TECHNOLOGY GROUP CO., LTD., Beijing (CN)

(72) Inventors: Dongxu Zhang, Beijing (CN); Yuqian Sun, Beijing (CN); Rongrong Gao, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 982 days.

(21) Appl. No.: 18/014,378

(22) PCT Filed: Nov. 18, 2021

(86) PCT No.: PCT/CN2021/131362

§ 371 (c)(1),
(2) Date: Jan. 4, 2023

(87) PCT Pub. No.: WO2022/188457

PCT Pub. Date: Sep. 15, 2022

(65) Prior Publication Data

US 2023/0255107 A1 Aug. 10, 2023

(30) Foreign Application Priority Data

Mar. 8, 2021 (CN) ........................ 202110252323.X

(51) Int. Cl.
*H10K 85/60* (2023.01)
*H10K 50/18* (2023.01)
(Continued)

(52) U.S. Cl.
CPC ....... *H10K 85/6572* (2023.02); *H10K 50/181* (2023.02); *H10K 85/633* (2023.02);
(Continued)

(58) Field of Classification Search
CPC ......................... H10K 2101/40; H10K 85/658
See application file for complete search history.

(56) References Cited

U.S. PATENT DOCUMENTS

2020/0006439 A1* 1/2020 Sun ...................... H10K 59/879
2020/0266379 A1* 8/2020 Li .......................... H10K 50/11
2022/0209132 A1* 6/2022 Liu ...................... C07D 263/57

FOREIGN PATENT DOCUMENTS

WO WO-2020138877 A1 * 7/2020 ........... H10K 85/658

* cited by examiner

*Primary Examiner* — Vu A Nguyen
(74) *Attorney, Agent, or Firm* — XSENSUS LLP

(57) ABSTRACT

A light-emitting device includes: a first electrode, functional layers and a second electrode that are sequentially arranged. The functional layers include: a light-emitting layer, material layers each having a hole transport function and located between the light-emitting layer and the first electrode, and material layer(s) having an electron transport function and located between the light-emitting layer and the second electrode; the material layers include an electron blocking layer; a material of the light-emitting layer includes a host material. A difference between an LUMO energy level of the electron blocking layer and an LUMO energy level of the host material is greater than or equal to 0.3 eV. Under a same test condition, a ratio of an order of magnitude of a hole mobility of the electron blocking layer to an order of magnitude of an electron mobility of the material layer(s) is greater than or equal to 1.

18 Claims, 2 Drawing Sheets

(51) Int. Cl.
*H10K 59/80* (2023.01)
*H10K 101/30* (2023.01)

(52) U.S. Cl.
CPC ......... *H10K 85/636* (2023.02); *H10K 85/657* (2023.02); *H10K 85/658* (2023.02); *H10K 59/879* (2023.02); *H10K 2101/30* (2023.02)

LIGHT-EMITTING DEVICE, LIGHT-EMITTING SUBSTRATE, AND LIGHT-EMITTING APPARATUS

CROSS-REFERENCE TO RELATED APPLICATIONS

This application is a national phase entry under 35 USC 371 of International Patent Application No. PCT/CN2021/131362 filed on Nov. 18, 2021, which claims priority to Chinese Patent Application No. 202110252323.X, filed on Mar. 8, 2021, which are incorporated herein by reference in their entirety.

TECHNICAL FIELD

The present disclosure relates to the field of lighting and display technologies, and in particular, to a light-emitting device, a light-emitting substrate and a light-emitting apparatus.

BACKGROUND

Organic light-emitting diodes (OLEDs) have characteristics of self-luminescence, wide viewing angle, quick response, high luminous efficiency, low operating voltage, small substrate thickness, being capability of being used for manufacturing a large-sized and bendable substrate, simple manufacturing process and the like, and is known as a next-generation "star" in the display technologies.

SUMMARY

In an aspect, a light-emitting device is provided. The light-emitting device includes: a first electrode and a second electrode that are arranged in sequence; and a plurality of functional layers disposed between the first electrode and the second electrode. The plurality of functional layers include: a light-emitting layer, at least two material layers each having a hole transport function and located between the light-emitting layer and the first electrode, and at least one material layer having an electron transport function and located between the light-emitting layer and the second electrode; the at least two material layers each having the hole transport function include an electron blocking layer; a material of the light-emitting layer includes a host material and a guest material. A difference between a lowest unoccupied molecular orbital (LUMO) energy level of a material of the electron blocking layer and an LUMO energy level of the host material is greater than or equal to 0.3 eV. Under a same test condition, a ratio of an order of magnitude of a hole mobility of the material of the electron blocking layer to an order of magnitude of an electron mobility of a material of the at least one material layer having the electron transport function is greater than or equal to 1.

In some embodiments, under a test condition of an electric field intensity of 5000 $V^{1/2}/m^{1/2}$, the electron mobility of the material of the at least one material layer having the electron transport function is in a range of $10^{-8}$ $cm^2V^{-1}s^{-1}$ to $10^{-7}$ $cm^2V^{-1}s^{-1}$, inclusive; and the hole mobility of the material of the electron blocking layer is in a range of $10^{-8}$ $cm^2V^{-1}s^{-1}$ to $10^{-6}$ $cm^2V^{-1}s^{-1}$, inclusive.

In some embodiments, the material of the electron blocking layer is selected from any one of structures as shown in a following general formula (I):

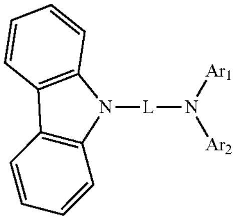

(I)

$Ar_1$ and $Ar_2$ are same or different, and are each independently selected from any one of substituted or unsubstituted $C_6$-$C_{30}$ aryl, and substituted or unsubstituted $C_2$-$C_{30}$ heteroaryl; and L is independently selected from any one of a single bond, substituted or unsubstituted $C_6$-$C_{30}$ arylene, and substituted or unsubstituted $C_2$-$C_{30}$ heteroarylene.

In some embodiments, the material of the electron blocking layer is selected from any one of structures as shown in following structural formulas:

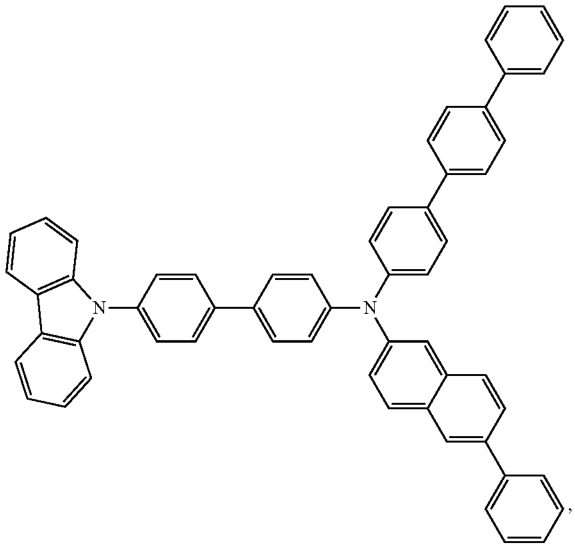

,

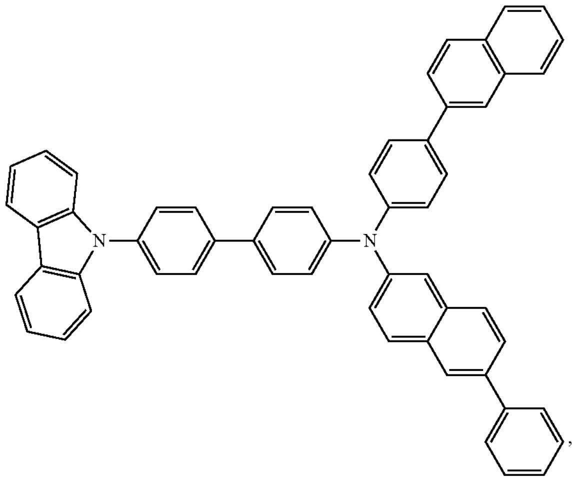

,

-continued

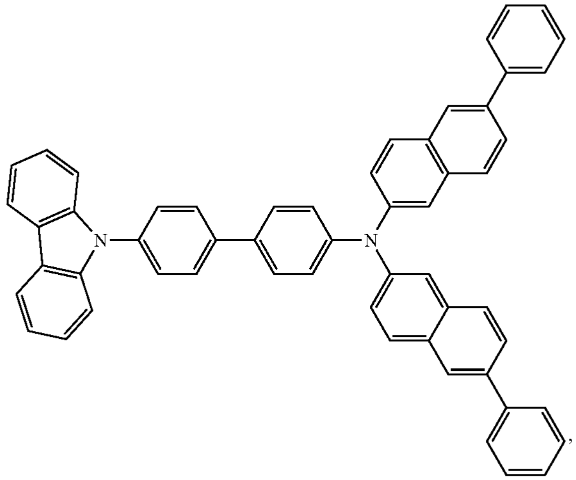

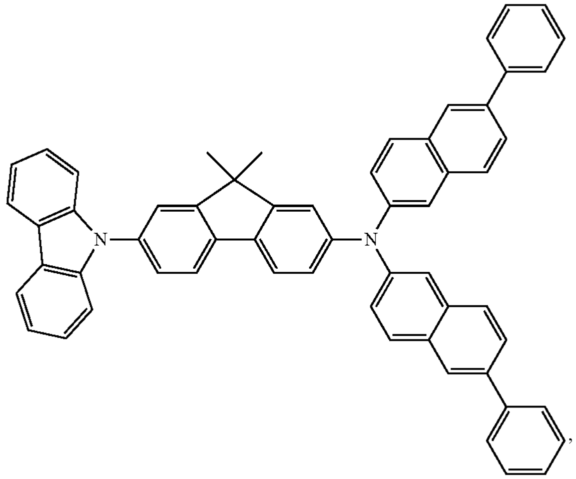

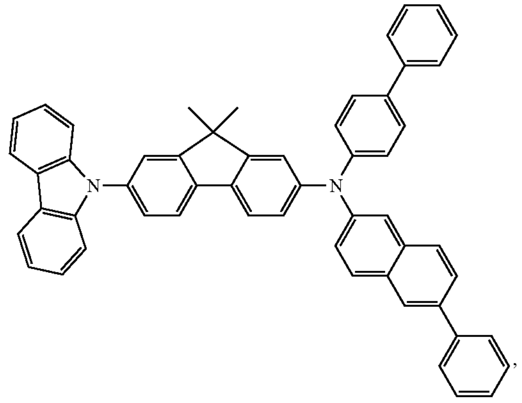

, and

-continued

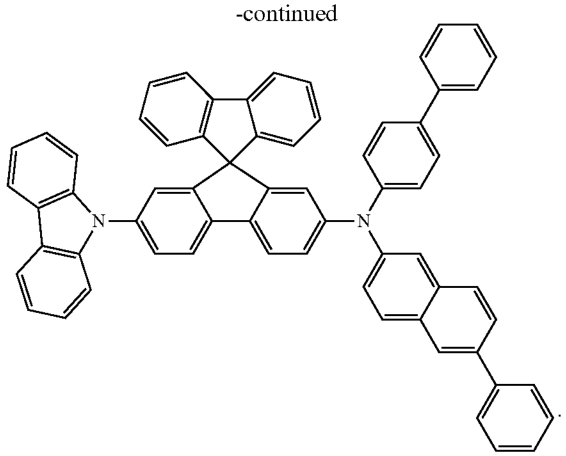

In some embodiments, the guest material is selected from any one of structures as shown in a following general formula (II):

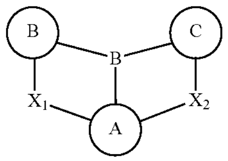

(II)

A, B and C are each independently selected from any one of substituted or unsubstituted $C_6$-$C_{30}$ aryl, and substituted or unsubstituted $C_2$-$C_{30}$ heteroaryl; $X_1$ and $X_2$ are same or different, and are each independently selected from N(R), R being selected from any one of hydrogen, substituted or unsubstituted $C_6$-$C_{30}$ aryl, substituted or unsubstituted $C_2$-$C_{30}$ heteroaryl, and substituted or unsubstituted $C_1$-$C_{30}$ alkyl.

In some embodiments, A, B and C are each independently selected from any one of phenyl, biphenylene and structures as shown in following structural formulas:

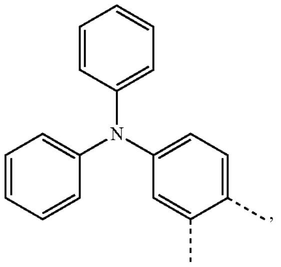

-continued

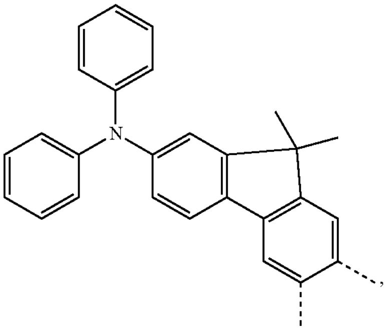

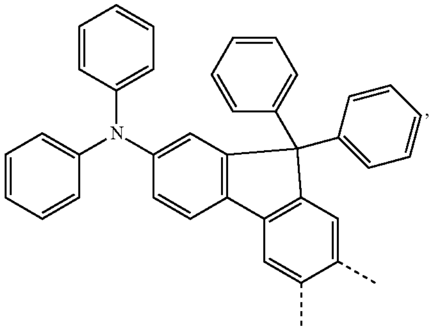

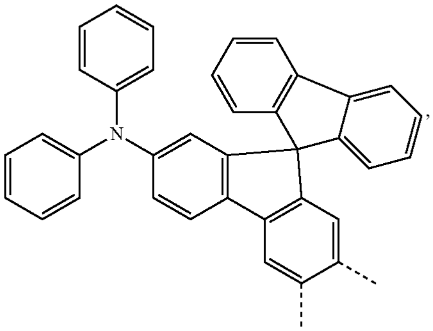

, and

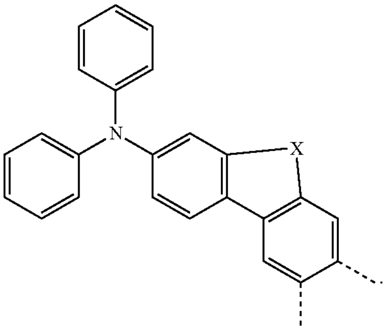

X is selected from O, S, Se or N—R, R being selected from any one of H, substituted or unsubstituted $C_6$-$C_{30}$ aryl, substituted or unsubstituted $C_2$-$C_{30}$ heteroaryl, and substituted or unsubstituted $C_1$-$C_{30}$ alkyl.

In some embodiments, the guest material is selected from any one of structures as shown in following structural formulas:

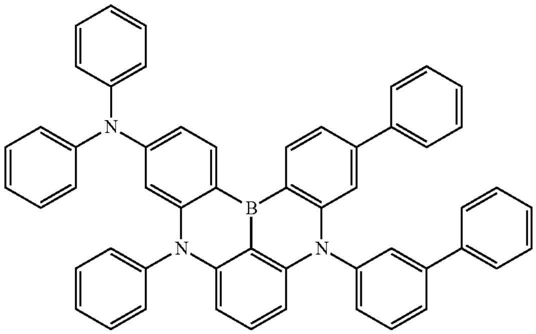

,

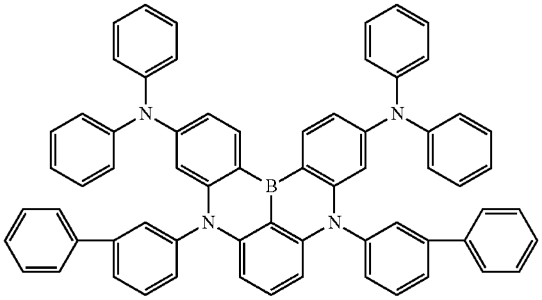

,

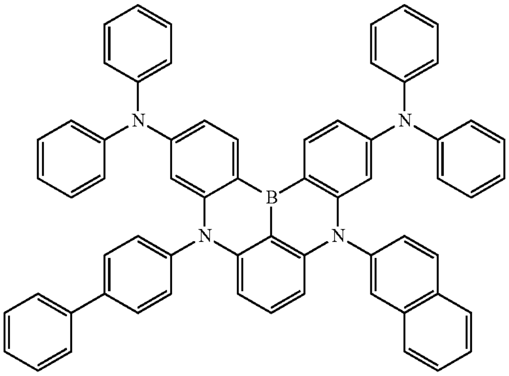

, and

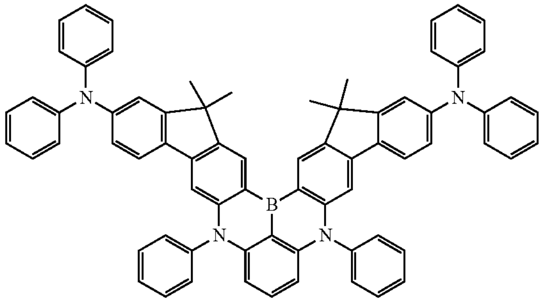

.

In another aspect, a light-emitting substrate is provided. The light-emitting substrate includes a substrate and a plurality of light-emitting devices disposed on the substrate. Each of at least one light-emitting device is the light-emitting device is the light-emitting device described above.

In some embodiments, the first electrode is closer to the substrate than the second electrode, and the second electrode is capable of transmitting light. The light-emitting substrate further includes a light extraction layer disposed on a side of the second electrode away from the substrate. A refractive index of the light extraction layer is greater than a refractive index of a material layer that is adjacent to the light extraction layer and located on a side of the light extraction layer proximate to the second electrode.

In some embodiments, for light with a wavelength of 620 nm, the refractive index of the light extraction layer is greater than or equal to 1.8.

In some embodiments, a material of the light extraction layer is selected from any one of structures as shown in following general formula (III):

(III)

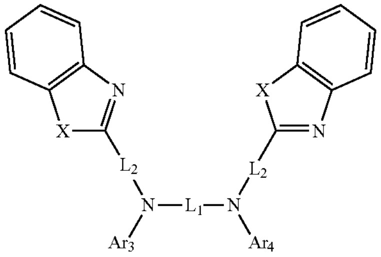

$Ar_3$, $Ar_4$ are same or different, and are each independently selected from substituted or unsubstituted $C_6$-$C_{30}$ aryl and substituted or unsubstituted $C_2$-$C_{30}$ heteroaryl; X is selected from O, S, Se or N—R, R being selected from any one of H, substituted or unsubstituted $C_6$-$C_{30}$ aryl, substituted or unsubstituted $C_2$-$C_{30}$ heteroaryl, and substituted or unsubstituted $C_1$-$C_{30}$ alkyl; $L_1$ is selected from any one of a single bond, substituted or unsubstituted $C_6$-$C_{30}$ arylene, and substituted or unsubstituted $C_2$-$C_{30}$ heteroarylene; and $L_2$ is selected from any one of a single bond, substituted or unsubstituted $C_6$-$C_{30}$ aryl, and substituted or unsubstituted $C_2$-$C_{30}$ heteroaryl.

In some embodiments, the material of the light extraction layer is selected from any one of structures as shown in following structural formulas:

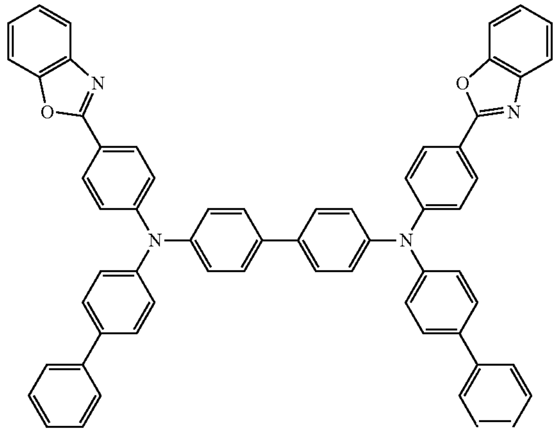
,

-continued

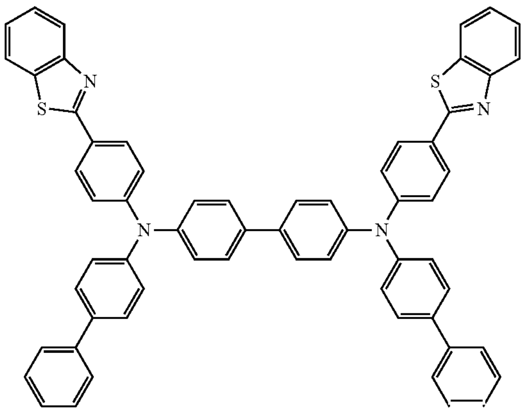
,

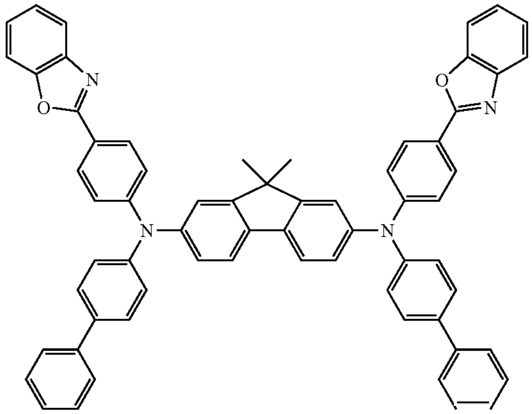
,

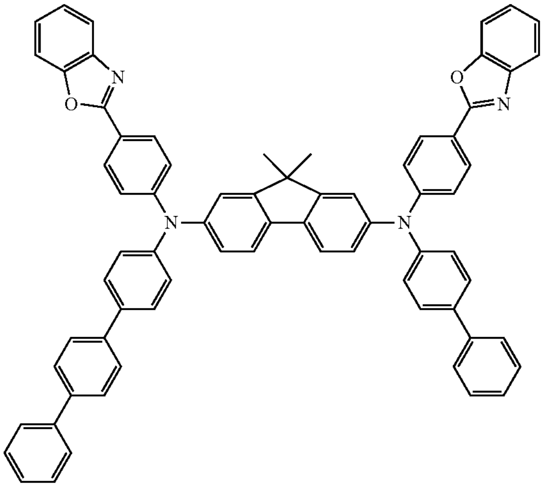
,

-continued

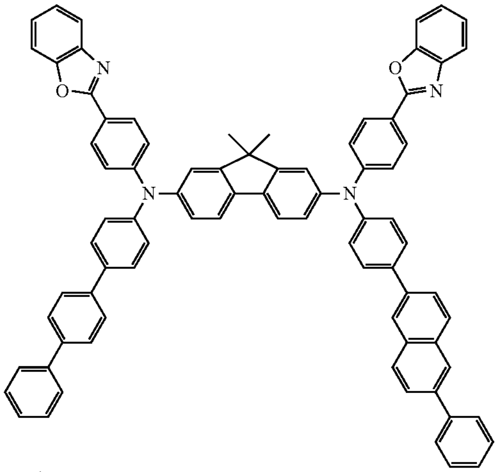

, and

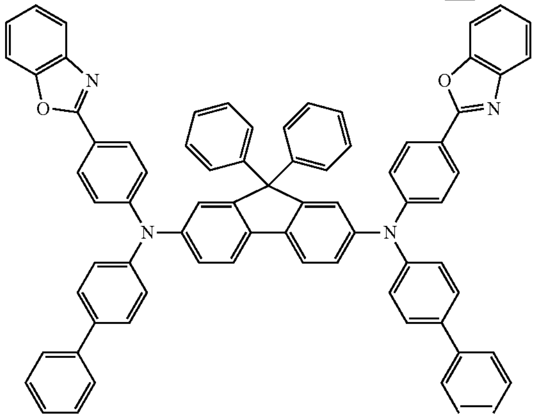

.

In yet another aspect, a light-emitting apparatus is provided. The light-emitting apparatus includes the light-emitting substrate described above.

In some embodiments, the guest material is selected from any one of compounds whose molecular ellipticities are greater than 1.8.

In some embodiments, under a test condition of an electric field intensity of 5000 $V^{1/2}/m^{1/2}$, a hole mobility of each of materials of the at least two material layers each having the hole transport function is in a range of $10^{-5}$ $cm^2V^{-1}s^{-1}$ to $10^{-4}$ $cm^2V^{-1}s^{-1}$, inclusive.

In some embodiments, the first electrode is closer to the substrate than the second electrode, and the second electrode is capable of transmitting light. The light-emitting substrate further includes a light extraction layer disposed on a side of the second electrode away from the substrate. The second electrode is in direct contact with the light extraction layer, and a refractive index of the light extraction layer is greater than a refractive index of the second electrode.

In some embodiments, the second electrode is made of a magnesium-silver alloy.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these drawings. In addition, the accompanying drawings in the following description may be regarded as schematic diagrams, and are not limitations on actual sizes of products, actual processes of methods and actual timings of signals involved in the embodiments of the present disclosure.

DETAILED DESCRIPTION

Figure 1:
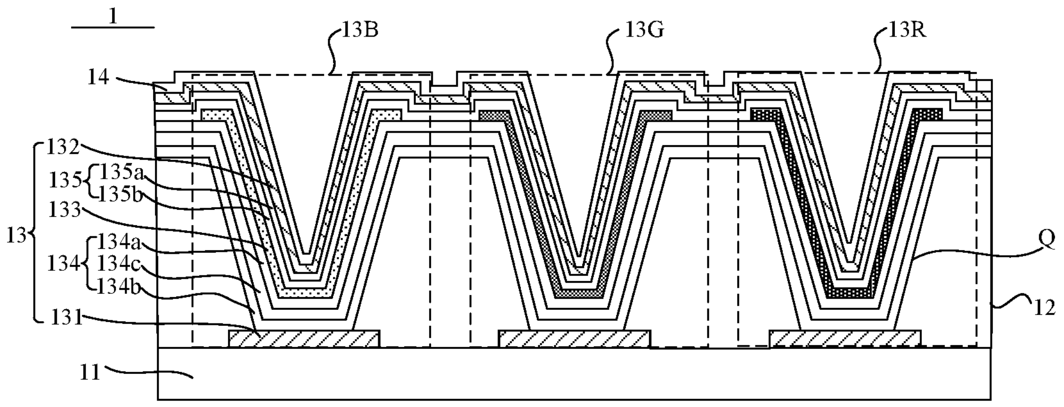
FIG. 1 is a sectional view of a light-emitting substrate, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the specification and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a plurality of" or "the plurality of" means two or more unless otherwise specified.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

The phrase "applicable to" or "configured to" used herein indicates an open and inclusive expression, which does not exclude devices that are applicable to or configured to perform additional tasks or steps.

In addition, the phase "based on" used herein is meant to be open and inclusive, since a process, a step, a calculation or other action that is "based on" one or more of the stated conditions or values may, in practice, be based on additional conditions or values exceeding those stated.

As used herein, the term such as "about" or "approximately" includes a stated value and an average value within an acceptable range of deviation of a particular value. The acceptable range of deviation is determined by a person of ordinary skill in the art in view of measurement in question and errors associated with measurement of a particular quantity (i.e., limitations of a measurement system).

Exemplary embodiments are described herein with reference to sectional views and/or plan views as idealized exemplary drawings. In the accompanying drawings, thicknesses of layers and sizes of regions are enlarged for clarity. Thus, variations in shape relative to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown to have a rectangular shape generally has a feature of being curved. Therefore, the regions shown in the accompanying drawings are schematic in nature, and their shapes are not intended to show actual shapes of regions in an apparatus, and are not intended to limit the scope of the exemplary embodiments.

Some embodiments of the present disclosure provide a light-emitting apparatus. The light-emitting apparatus includes a light-emitting substrate. Of course, the light-emitting apparatus may further include other components. For example, the other components may include a circuit for providing electrical signals for the light-emitting substrate to drive the light-emitting substrate to emit light; the circuit may be referred to as a control circuit. The other components may also include a circuit board electrically connected to the light-emitting substrate and/or an integrated circuit (IC) electrically connected to the light-emitting substrate.

In some embodiments, the light-emitting apparatus may be a lighting apparatus. In this case, the light-emitting apparatus serves as a light source for achieving a lighting function. For example, the light-emitting apparatus may be a backlight module in a liquid crystal display apparatus, a lamp for internal or external lighting, or a lamp in various signal lamps.

In some other embodiments, the light-emitting apparatus may be a display apparatus. In this case, the light-emitting substrate is a display substrate, and is used to achieve a function of displaying images (i.e., pictures). The light-emitting apparatus may include a display or a product including the display. The display may be a flat panel display (FPD), a micro display, etc. If classified according to whether a user can see a scene behind the display, the display may be a transparent display or a non-transparent display. If classified according to whether the display can be bent or rolled, the display may be a flexible display or a normal display (which may be referred to as a rigid display). For example, the product including the display may include: a computer display, a television, a billboard, a laser printer having a display function, a telephone, a mobile phone, a personal digital assistant (PDA), a laptop computer, a digital camera, a portable camcorder, a viewfinder, a vehicle, a large-area wall, a screen in a theater, or a sign in a stadium.

Some embodiments of the present disclosure provide a light-emitting substrate. As shown in FIG. 1, the light-emitting substrate 1 includes a substrate 11, a pixel define layer 12 and a plurality of light-emitting devices 13 that are disposed on the substrate 11. The pixel define layer 12 has a plurality of openings Q, and the plurality of light-emitting devices 13 may be arranged in the plurality of openings Q in one-to-one correspondence. Here, the plurality of light-emitting devices 13 may be all or part of light-emitting devices 13 included in the light-emitting substrate 1; the plurality of openings Q may be all or part of openings in the pixel define layer 12.

At least one light-emitting device 13 in the plurality of light-emitting devices 13 may include: a first electrode 131 and a second electrode 132 that are arranged in sequence, and a plurality of functional layers 133 disposed between the first electrode 131 and the second electrode 132.

In some embodiments, as shown in FIG. 1, the first electrode 131 may be an anode. In this case, the second electrode 132 is a cathode. In some other embodiments, the first electrode 131 may be a cathode. In this case, the second electrode 132 is an anode.

In some embodiments, a material of the anode may be selected from high work function materials such as indium tin oxide (ITO), indium zinc oxide (IZO) or composite materials (e.g., silver (Ag)/ITO, aluminum (Al)/ITO, Ag/IZO or Al/IZO). "Ag/ITO" refers to a stacked structure in which a silver electrode and an ITO electrode are stacked. A material of the cathode may be selected from low work function materials, such as low work function metal materials (e.g., Al, Ag, or magnesium (Mg)) or low work function metal alloy materials (e.g., Mg—Al alloy or Mg—Ag alloy).

In some embodiments, as shown in FIG. 1, the plurality of functional layers include: a light-emitting layer 133, at least two material layers 134 each having a hole transport function and located between the light-emitting layer 133 and the first electrode 131, and at least one material layer 135 having an electron transport function and located between the light-emitting layer 133 and the second electrode 132. The at least two material layers 134 each having the hole transport function include an electron blocking layer **134*a*. A material of the light-emitting layer 133 includes a host material and a guest material. A difference between a lowest unoccupied molecular orbital (LUMO) energy level of a material of the electron blocking layer 134*a* and an LUMO energy level of the host material is greater than or equal to a threshold value. In addition, under a same test condition, a ratio of an order of magnitude of a hole mobility of the material of the electron blocking layer 134*a* and an order of magnitude of an electron mobility of a material of the at least one material layer 135** having the electron transport function is greater than or equal to 1.

The electron blocking layer **134*a* plays a role of blocking the diffusion of electrons transmitted from the light-emitting layer 133, and confines the electrons and holes to a light-emitting region to improve an efficiency. According to a case where a transport velocity of electrons is greater than a transport velocity of holes in the light-emitting device 13, it can be known that the an exciton recombination zone is at an interface between the electron blocking layer 134*a* and the light-emitting layer 133. By providing the electron blocking layer 134*a*, it may be possible to prevent the electrons from entering a hole transport layer, which improves a service life of the device. This requires that the material of the electron blocking layer 134*a* has a relatively high LUMO energy level. That is, there is a relatively large difference between the LUMO energy level of the material of the electron blocking layer 134*a*** and the LUMO energy level of the host material (BH). For example, the threshold may be 0.3 eV.

According to a case where the LUMO energy level of the host material may be in a range of −3.0 eV to −2.6 eV, inclusive, it can be known that the LUMO energy level of the material of the electron blocking layer **134*a* is in a range of −2.6 eV to −2.3 eV, inclusive. As long as the difference between the LUMO energy level of the material of the electron blocking layer 134***a* and the LUMO energy level of the host material is greater than or equal to 0.3 eV.

For example, in a case where the LUMO energy level of the host material is −2.6 eV, the LUMO energy level of the material of the electron blocking layer 134*a* may be −2.3 eV; in a case where the LUMO energy level of the host material is −2.7 eV, the LUMO energy level of the material of the electron blocking layer 134*a* may be −2.3 eV or −2.4 eV; in a case where the LUMO energy level of the host material is −2.8 eV, the LUMO energy level of the material of the electron blocking layer 134*a* may be −2.3 eV, −2.4 eV or −2.5 eV; in a case where the LUMO energy level of the host material is −2.9 eV, the LUMO energy level of the material of the electron blocking layer 134*a* may be −2.3 eV, −2.4 eV, −2.5 eV or −2.6 eV; and in a case where the LUMO energy level of the host material is −3.0 eV, the LUMO energy level of the material of the electron blocking layer 134*a* may be −2.3 eV, −2.4 eV, −2.5 eV or −2.6 eV.

The order of magnitude refers to a scale or a level of magnitude, and the levels of the magnitude maintain a fixed ratio therebetween. A single-digit number less than 10 (e.g., a number of 1 to 9) is in an order of magnitude; a double-digit number (e.g., 12 or 18) is in an order of magnitude. The double-digit number is one order of magnitude higher than the single-digit number. By analogy, a triple-digit number is one order of magnitude higher than the double-digit number and two orders of magnitude higher than the single-digit number.

The orders of magnitude may be referred to as a series of powers of 10, and are usually represented in the form of $a\times10^b$, where a is any value greater than 1 and less than 10, which may be an integer in a range of 1 to 9, inclusive, or a decimal greater than 1 and less than 10, such as 1.5, 2.5, 4.5, 6.8, or 7.9; $10^b$ represents the order of magnitude, and b represents the order of magnitude. A ratio of two adjacent orders of magnitude is 10. For example, there are three orders of magnitude between two numbers (that is, a difference between the values of b of the two numbers is 3), which actually means that the order of magnitude of a number in the two numbers is 1000 times the order of magnitude of another number in the two numbers.

In the embodiments of the present disclosure, under the same test condition, the ratio of the order of magnitude of the hole mobility of the material of the electron blocking layer 134*a* to the order of magnitude of the electron mobility of the material of the at least one material layer 135 having the electron transport function is greater than or equal to 1, which means that, under the same test condition, the hole mobility of the material of the electron blocking layer 134*a* may be greater than, less than or equal to the electron mobility of the material of the at least one material layer 135 having the electron transport function.

The same test condition refers to a condition in which other test conditions are the same except different test samples.

In some embodiments, under a test condition of an electric field intensity of 5000 $V^{1/2}/m^{1/2}$, the electron mobility of the material of the at least one material layer 135 having the electron transport function is in a range of $10^{-8}$ $cm^2V^{-1}s^{-1}$ to $10^{-7}$ $cm^2V^{-1}s^{-1}$, inclusive; and the hole mobility of the material of the electron blocking layer 134*a* is in a range of $10^{-8}$ $cm^2V^{-1}s^{-1}$ to $10^{-6}$ $cm^2V^{-1}s^{-1}$, inclusive.

Here, the same test condition refers to the test condition of the electric field intensity of 5000 $V^{1/2}/m^{1/2}$. A manner for testing the mobility may be selected from any one of a time-of-flight (TOF) manner and a space-charge limited current (SCLC) manner.

In a case where the ratio of the order of magnitude of the hole mobility of the material of the electron blocking layer 134*a* to the order of magnitude of the electron mobility of the material of the at least one material layer 135 having the electron transport function is equal to 1, the order of magnitude of the hole mobility of the material of the electron blocking layer 134*a* and the order of magnitude of the electron mobility of the material of the at least one material layer 135 having the electron transport function are the same. In this case, considering an example in which, under the test condition of the electric field intensity of 5000 $V^{1/2}/m^{1/2}$, the hole mobility of the material of the electron blocking layer 134*a* is $5\times10^{-8}$ $cm^2V^{-1}s^{-1}$, the electron mobility of the material of the at least one material layer 135 having the electron transport function may be $1\times10^{-8}$ $cm^2V^{-1}s^{-1}$, $2\times10^{-8}$ $cm^2V^{-1}s^{-1}$, $3\times10^{-8}$ $cm^2V^{-1}s^{-1}$, $4\times10^{-8}$ $cm^2V^{-1}s^{-1}$, $5\times10^{-8}$ $cm^2V^{-1}s^{-1}$, $6\times10^{-8}$ $cm^2V^{-1}s^{-1}$, $7\times10^{-8}$ $cm^2V^{-1}s^{-1}$, $8\times10^{-8}$ $cm^2V^{-1}s^{-1}$ or $9\times10^{-8}$ $cm^2V^{-1}s^{-1}$. In a case where the electron mobility of the material of the at least one material layer 135 having the electron transport function is $1\times10^{-8}$ $cm^2V^{-1}s^{-1}$, $2\times10^{-8}$ $cm^2V^{-1}s^{-1}$, $3\times10^{-8}$ $cm^2V^{-1}s^{-1}$ or $4\times10^{-8}$ $cm^2V^{-1}s^{-1}$, the hole mobility of the material of the electron blocking layer 134*a* is greater than the electron mobility of the material of the at least one material layer 135 having the electron transport function; in a case where the electron mobility of the material of the at least one material layer 135 having the electron transport function is $5\times10^{-8}$ $cm^2V^{-1}s^{-1}$, the hole mobility of the material of the electron blocking layer 134*a* is equal to the electron mobility of the material of the at least one material layer 135 having the electron transport function; and in a case where the electron mobility of the material of the at least one material layer 135 having the electron transport function is $6\times10^{-8}$ $cm^2V^{-1}s^{-1}$, $7\times10^{-8}$ $cm^2V^{-1}s^{-1}$, $8\times10^{-8}$ $cm^2V^{-1}s^{-1}$ or $9\times10^{-8}$ $cm^2V^{-1}s^{-1}$, the hole mobility of the material of the electron blocking layer 134*a* is less than the electron mobility of the material of the at least one material layer 135 having the electron transport function.

The ratio of the order of magnitude of the hole mobility of the material of the electron blocking layer 134*a* to the order of magnitude of the electron mobility of the material of the at least one material layer 135 having the electron transport function is greater than 1. In this case, considering an example in which, under the test condition of the electric field intensity of 5000 $V^{1/2}/m^{1/2}$, the hole mobility of the material of the electron blocking layer 134*a* is 5x10−7 $cm^2V^{-1}s^{-1}$, the electron mobility of the material of the at least one material layer 135 having the electron transport function may be $1\times10^{-8}$ $cm^2V^{-1}s^{-1}$, $2\times10^{-8}$ $cm^2V^{-1}s^{-1}$, $3\times10^{-8}$ $cm^2V^{-1}s^{-1}$, $4\times10^{-8}$ $cm^2V^{-1}s^{-1}$, $5\times10^{-8}$ $cm^2V^{-1}s^{-1}$, $6\times10^{-8}$ $cm^2V^{-1}s^{-1}$, $7\times10^{-8}$ $cm^2V^{-1}s^{-1}$, $8\times10^{-8}$ $cm^2V^{-1}s^{-1}$ or $9\times10^{-8}$ $cm^2V^{-1}s^{-1}$.

In the embodiments of the present disclosure, in a case where the LUMO energy level of the material of the electron blocking layer 134*a* is determined, an electron blocking material having relatively high hole mobility is selected to change a current condition in which the exciton recombination zone is at the interface between the electron blocking layer 134*a* and the light-emitting layer 133 in the related art, so as to make the exciton recombination zone move toward a center of the light-emitting layer 133. It may further prevent the electrons from entering the hole transport layer, thereby improving the service life of the device, and reducing quenching of electrons; furthermore, it may be possible to make electrons and holes combine in the light-emitting region to emit light better, thereby improving the efficiency.

A position of the exciton recombination zone is not only related to both the hole mobility of the material of the electron blocking layer 134*a* and the electron mobility of the material of the at least one material layer 135 having the electron transport function, but also related to hole mobilities of materials of the at least two material layers 134 each having the hole transport function.

In some embodiments, under the test condition of the electric field intensity of 5000 $V^{1/2}/m^{1/2}$, the hole mobility of each of the materials of the at least two material layers 134 each having the hole transport function may be in a range of $10^{-5}$ $cm^2V^{-1}s^{-1}$ to $10^{-4}$ $cm^2V^{-1}s^{-1}$, inclusive.

In these embodiments, a technical effect of the exciton recombination zone moving toward the center of the light-emitting layer 133 may be achieved.

In some embodiments, the material of the electron blocking layer 134*a* may be selected from any one of structures as shown in the following general formula (I).

(I)

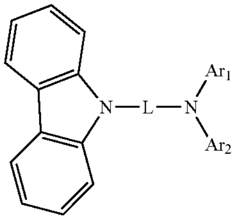

$Ar_1$ and $Ar_2$ are the same or different, and are each independently selected from any one of substituted or unsubstituted $C_6$-$C_{30}$ aryl, and substituted or unsubstituted $C_2$-$C_{30}$ heteroaryl; L is independently selected from any one of a single bond, substituted or unsubstituted $C_6$-$C_{30}$ arylene, and substituted or unsubstituted $C_2$-$C_{30}$ heteroarylene.

The material of the electron blocking layer 134*a* has a structure of carbazole and arylamine, and has a relatively high LUMO energy level and hole mobility.

In organic chemistry, the term "aryl" refers to any functional group or substituent derived from a simple aromatic ring, and is a general term for a monovalent radical derived from an aromatic hydrocarbon molecule by the removal of one hydrogen atom from a carbon atom of the aromatic nucleus. The simplest aryl is phenyl, which is derived from benzene. The phenyl is monocyclic aryl. Of course, in addition to monocyclic aryl, aryl may also include polycyclic aryl and fused ring aryl.

The term "heteroaryl" is a general term for a monovalent radical derived from a heterocyclic aromatic hydrocarbon molecule by the removal of one hydrogen atom from a carbon atom of the nucleus. For example, pyridyl and furyl are each monocyclic heteroaryl. Similar to aryl, in addition to monocyclic heteroaryl, heteroaryl may also include polycyclic heteroaryl and fused ring heteroaryl.

Correspondingly, the term "arylene" is a general term for a divalent radical derived from the aromatic hydrocarbon molecule by removal of one hydrogen atom from each of two carbon atoms of the nucleus. Similar to aryl, arylene may include monocyclic arylene (e.g., divalent phenyl), polycyclic arylene (e.g., divalent biphenylene), and fused ring arylene (e.g., divalent naphthyl, divalent fluorenyl, and divalent spirofluorenyl).

The term "heteroarylene" is a general term for a divalent radical derived from the heterocyclic aromatic hydrocarbon molecule by removal of one hydrogen atom from each of two carbon atoms of the nucleus. Similar to heteroaryl, heteroarylene may include monocyclic heteroarylene (e.g., bivalent pyridyl), polycyclic heteroarylene (e.g., bivalent bigeminal pyridyl), and fused ring heteroarylene (e.g., divalent benzofuranyl or divalent carbazolyl).

In a case where L is a single bond, a structural formula of the general formula (I) may be expressed as the following formula (I_1):

(I_1)

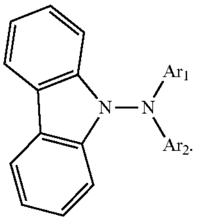

In some embodiments, the material of the electron blocking layer 134*a* is selected from any one of structures as shown in the following structural formulas:

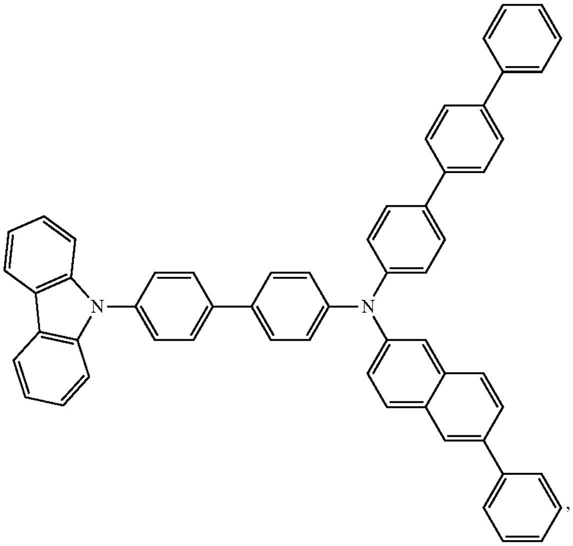

,

-continued

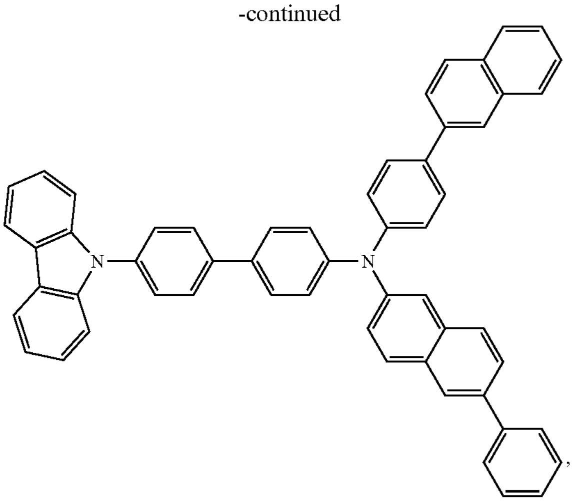

,

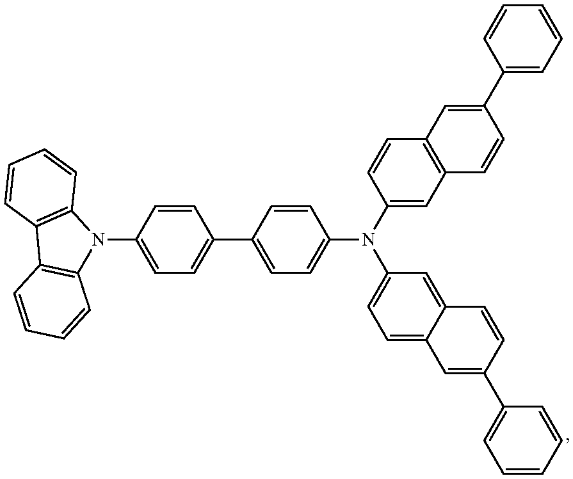

,

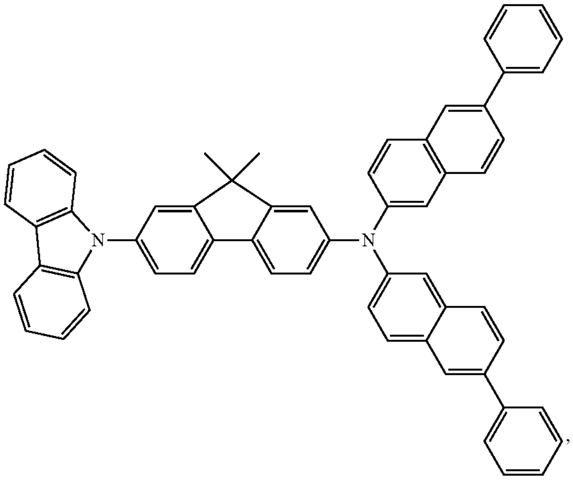

,

-continued

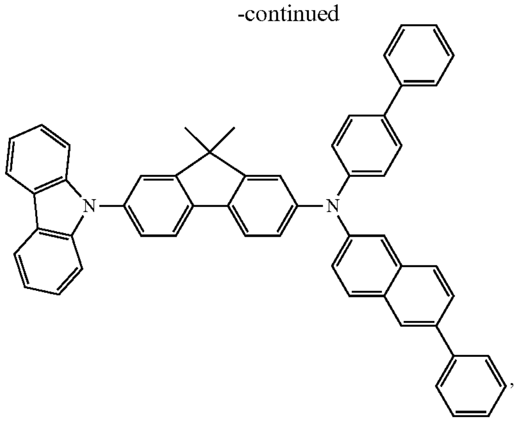

, and

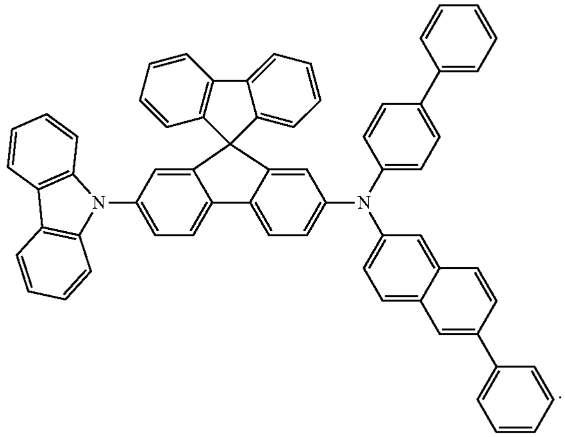

.

In some embodiments, as shown in FIG. 1, in addition to the electron blocking layer 134*a*, the at least two material layers 134 each having the hole transport function may further include a hole injection layer 134*b* and a hole transport layer 134*c*. The at least one material layer 135 having the electron transport function may include an electron injection layer 135*a* and an electron transport layer 135*b*.

In some embodiments, a material of the hole injection layer 134*b* may be selected from copper (II) phthalocyanine (CuPc), Hexaazatriphenylenehexacabonitrile (HATCN), $MnO_3$ and 4,4',4"-Tris[(3-methylphenyl)phenylamino]triphenylamine (m-MTDATA), or selected from materials in which these materials are p-doped. A thickness of the hole injection layer 134*b* may be in a range of 5 nm to 30 nm, inclusive.

A material of the hole transport layer 134*c* may be selected from any one of 4,4',4"-Tris[2-naphthalene(phenyl)amino]triphenylamine (2-TNATA), 4,4'-cyclohexylbis[N,N-bis(4-methylphenyl)aniline] and m-MTDATA.

A material of the electron injection layer 135*a* may be selected from low work function metals (e.g., lithium (Li), calcium (Ca) and ytterbium (Yb)), or may be selected from metal salts (e.g., lithium fluoride (LiF) and $LiQ_3$). A thickness of the electron injection layer 135*a* may be in a range of 0.5 nm to 2 nm, inclusive.

A material of the electron transport layer 135*b* may be selected from organic materials with good electron transport properties, or may be selected from materials in which the organic material are doped with $LiQ_3$, Li, Ca, or the like. A thickness of the electron transport layer 135*b* may be in a range of 10 nm to 70 nm, inclusive.

The light-emitting substrate 1 may be further provided with a driving circuit connected to all light-emitting devices 13 therein. The driving circuit may be connected to the control circuit to drive each light-emitting device 13 to emit light according to a respective electrical signal input by the control circuit. The driving circuit may be an active driving circuit or a passive driving circuit.

The light-emitting substrate 1 may emit white light, monochromatic light (single-color light), or color-adjustable light.

In a first example, the light-emitting substrate 1 may emit the white light. In this case, as shown in FIG. 1, the plurality of light-emitting devices 13 may include light-emitting devices 13R that emit red light, light-emitting devices 13G that emit green light, and light-emitting devices 13B that emit blue light. The light-emitting devices 13B that emit the blue light, the light-emitting devices 13R that emit the red light and the light-emitting devices 13G that emit the green light are controlled to emit light at the same time, which may achieve light mixing of the light-emitting devices 13B that emit the blue light, the light-emitting devices 13R that emit the red light and the light-emitting devices 13G that emit the green light, thereby enabling the light-emitting substrate 1 to emit the white light.

In this example, the light-emitting substrate 1 may be used for lighting. That is, the light-emitting substrate 1 may be applied to a lighting apparatus.

In a second example, the light-emitting substrate 1 may emit the monochromatic light. In this case, there are two possible situations. In a first situation, the plurality of light-emitting devices include light-emitting devices 13R that emit red light, light-emitting devices 13G that emit green light, and light-emitting devices 13B that emit blue light. Light-emitting devices that emit a same color light are controlled to emit light, so that the light-emitting substrate 1 may emit the monochromatic light. In a second situation, the plurality of light-emitting devices include only light-emitting devices that emit a same color light, such as light-emitting devices 13G that emit the green light. The plurality of light-emitting devices are controlled to emit light, which may achieve that the light-emitting substrate 1 emits the monochromatic light. In this example, the light-emitting substrate 1 may be used for lighting (that is, the light-emitting substrate 1 may be applied to the lighting apparatus), or the light-emitting substrate 1 may be used for displaying images or pictures of a single-color (that is, the light-emitting substrate 1 may be applied to a display apparatus).

In a third example, the light-emitting substrate 1 may emit the color-adjustable light (i.e., colored light). The light-emitting substrate 1 is similar to the light-emitting substrate 1, which has the plurality of light-emitting devices 13, described in the first example in structure. A color and brightness of mixed light emitted by the light-emitting substrate 1 may be controlled by controlling luminance of each light-emitting device 13, thereby achieving emitting the colored light.

In this example, the light-emitting substrate 1 may be used for displaying images or pictures. That is, the light-emitting substrate 1 may be applied to a display apparatus. Of course, the light-emitting substrate 1 may also be applied to the lighting apparatus.

Figure 2:
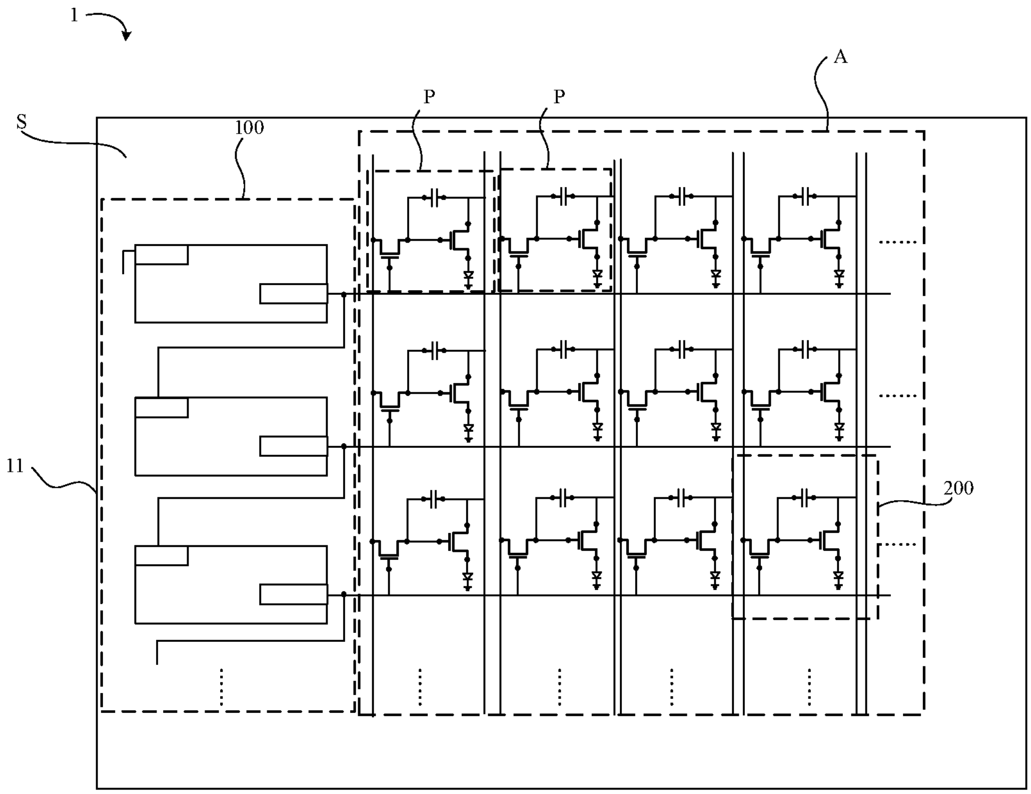
FIG. 2 is a top view of a light-emitting substrate, in accordance with some embodiments.

In the third example, in an example where the light-emitting substrate 1 is a display substrate, such as a full color display panel. As shown in FIG. 2, the light-emitting substrate 1 includes a display area A and a peripheral area S disposed around the display area A. The display area A includes a plurality of sub-pixel regions P. Each sub-pixel region P corresponds to an opening, and the opening corresponds to a light-emitting device. Each sub-pixel region P is provided therein with a pixel driving circuit 200 for driving a corresponding light-emitting device to emit light. The peripheral area S is used for wiring. For example, the peripheral area S is used for arranging a gate driving circuit 100 connected to the pixel driving circuits 200.

In some embodiments, the guest material is selected from any one of compounds whose molecular ellipticities are greater than 1.8. The molecular ellipticity is measured by circular dichroism (CD), and indicates that the material absorbs the right circularly polarized light and left circularly polarized light to different degrees due to optical asymmetry of the molecule.

In these embodiments, the difference between the LUMO energy level of the material of the electron blocking layer 134*a* and the LUMO energy level of the host material, the hole mobility of the material of the electron blocking layer 134*a*, and the electron mobility of the material of the at least one material layer 135 having the electron transport function are determined to minimize the quenching of electrons and make the exciton recombination zone move to the center of the light-emitting layer 133. In this case, the compound whose molecular ellipticity is greater than 1.8 is selected, which may enable the guest material to have a good orientation in a state of a film. That is, molecules are arranged in such a way that long axes thereof (that is, the molecule may be regarded as a molecule in a shape of an ellipse, and a long axis of the ellipse is the long axis of the molecule) are parallel to a plane of the film, which is conducive to light extraction. As a result, the luminous efficiency is further improved. That is, the material of the electron blocking layer 134*a* and the material of the guest material that are selected in the embodiments of the present disclosure jointly determine that the light-emitting device has a relatively high efficiency.

In some embodiments, the guest material is selected from any one of structures as shown in the following general formula (II).

(II)

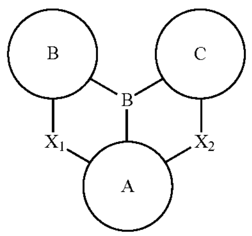

A, B and C are each independently selected from any one of substituted or unsubstituted $C_6$-$C_{30}$ aryl or substituted or unsubstituted $C_2$-$C_{30}$ heteroaryl; $X_1$ and $X_2$ are the same or different, and are each independently selected from N(R), R being selected from any one of hydrogen, substituted or unsubstituted $C_6$-$C_{30}$ aryl, substituted or unsubstituted $C_2$-$C_{30}$ heteroaryl, and substituted or unsubstituted $C_1$-$C_{30}$ alkyl.

In organic chemistry, the term "aryl" refers to any functional group or substituent derived from a simple aromatic ring, and is a general term for a monovalent radical derived from an aromatic hydrocarbon molecule by the removal of one hydrogen atom from a carbon atom of the aromatic nucleus. The simplest aryl is phenyl, which is derived from benzene. Phenyl is monocyclic aryl. Of course, in addition to monocyclic aryl, aryl may also include polycyclic aryl and fused ring aryl.

The term "heteroaryl" is a general term for a monovalent radical derived from a heterocyclic aromatic hydrocarbon molecule by the removal of one hydrogen atom from a carbon atom of the nucleus. For example, pyridyl and furyl are each monocyclic heteroaryl. Similar to aryl, in addition to monocyclic heteroaryl, heteroaryl may also include polycyclic heteroaryl and fused ring heteroaryl.

The term "alkyl" is a general term for a monovalent radical derived from alkane by removal of one hydrogen atom.

In these examples, the guest material having a nucleus of trivalent organoboron has a conjugated system formed by an empty p orbital and π orbital, and has strong electron accepting ability and good charge transportability, which may improve the light-emitting performance.

In some embodiments, A, B, and C are each independently selected from any one of the phenyl, biphenylene, and structures as shown in following structural formulas:

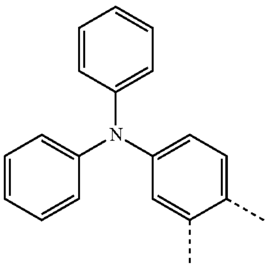
,

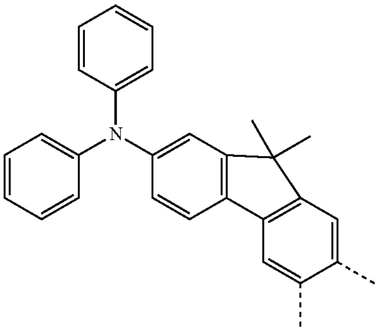
,

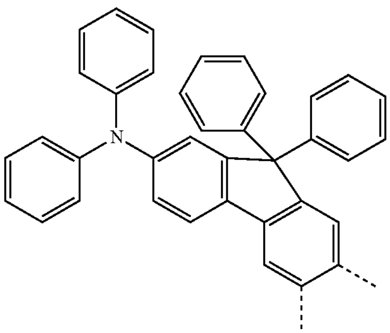
,

-continued

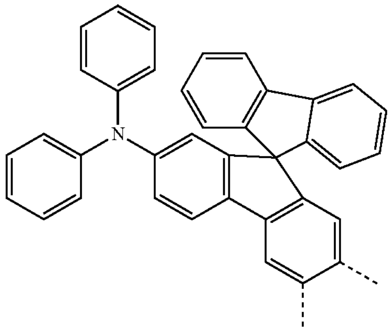
, and

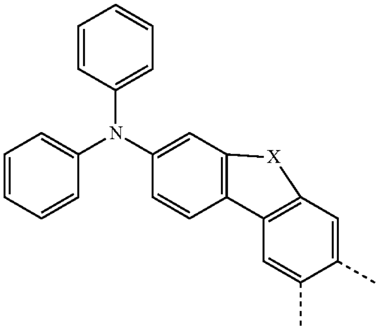
.

X is selected from O, S, Se or N—R, R being selected from any one of H, substituted or unsubstituted $C_6$-$C_{30}$ aryl, substituted or unsubstituted $C_2$-$C_{30}$ heteroaryl, and substituted or unsubstituted $C_1$-$C_{30}$ alkyl.

That is, A, B, and C may each have a conjugated system with an electron donating group. By introducing electron donating groups, it may be possible to enhance the fluorescence emission intensity and excited state charge transfer (CT) characteristics of the guest material (BD). As a result, the luminous efficiency is further improved.

In these embodiments, in a case where the structure (i.e., triphenylamine) as shown in the following structural formula (II_1') is selected as A and B, and phenyl is selected as C, the structural formula of the general formula (II) may be expressed as the following formula (II_1).

(II_1')

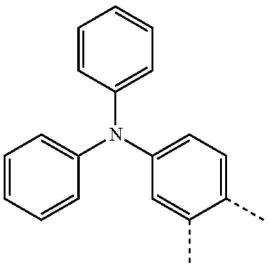

-continued (II_1)

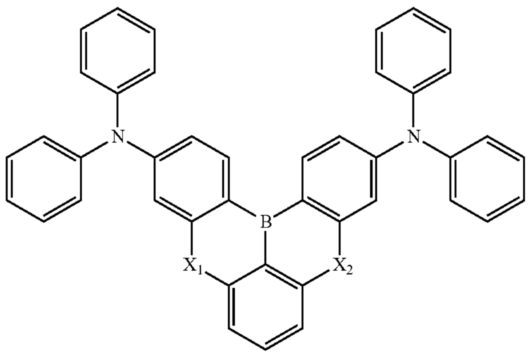

In some embodiments, the guest material (BD) is selected from any one of structures as shown in the following structural formulas:

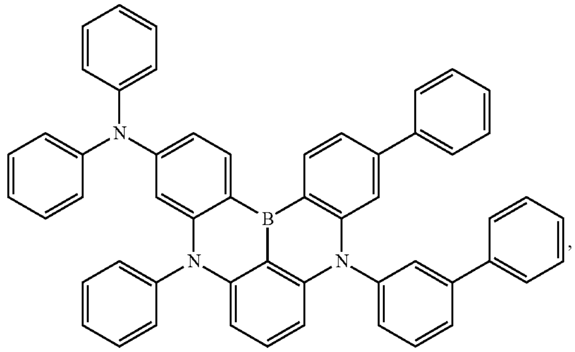

,

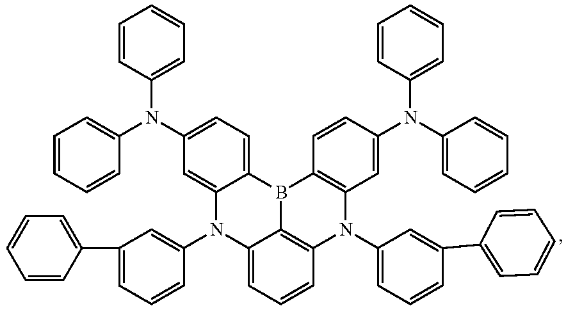

,

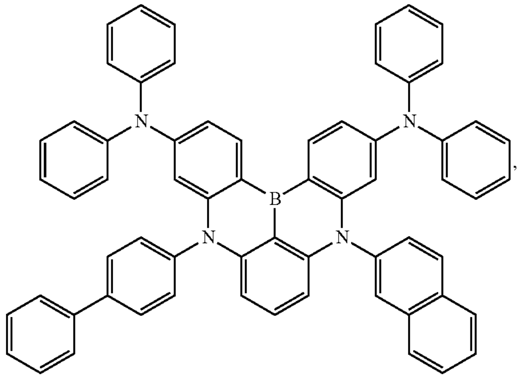

, and

-continued

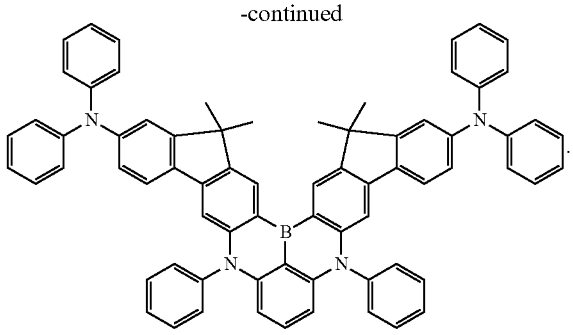

.

The guest material (BD) having the above structure may emit the ultrapure blue light, and has a relatively small full width at half maximum and a relatively high device efficiency. In a case where the molecular ellipticity is relatively high, it is conductive to the light extraction, thereby improving the luminous efficiency of the light-emitting device 13. In some embodiments, the host material (BH) may be selected from any one of derivatives of anthracene.

Figure 3:
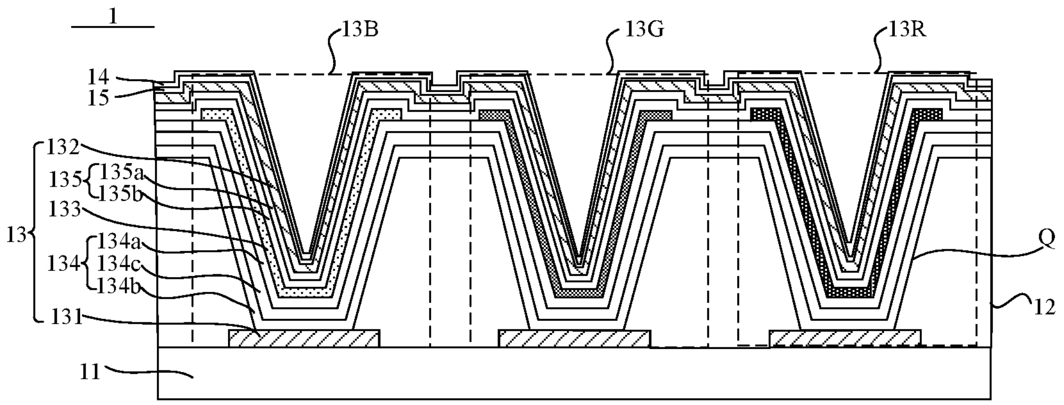
FIG. 3 is a sectional view of another light-emitting substrate, in accordance with some embodiments.

In some embodiments, as shown in FIG. 3, the first electrode 131 is closer to the substrate 11 than the second electrode 132, and the second electrode 132 is capable of transmitting light. The light-emitting substrate 1 may further include a light extraction layer 14 disposed on a side of the second electrode 132 away from the substrate 11. A refractive index of the light extraction layer 14 is greater than a refractive index of a material layer 15 that is adjacent to the light extraction layer 14 and located on a side of the light extraction layer 14 proximate to the second electrode 132.

In these embodiments, the light-emitting device 13 may be a top-emission light-emitting device. when light is directed from a medium (which is referred to as a first medium here) to another medium (which is referred to as a second medium here), there should be part of the light reflected back to the first medium, and the part of the light is referred to as reflected light. However, in a case where a refractive index of the first medium is greater than a refractive index of the second medium (that is, the light is directed from an optically denser medium to an optically thinner medium), a refraction angle is greater than an incident angle. Thus, the incident angle increases, and the refraction angle also increases. However, the refraction angle increases to 90 degrees earlier than the refraction angle. At this time, the incident angle is referred to as a critical angle; in this case, there is no refracted light, and there is only the reflected light. This is referred to as the total reflection. According to the law of total reflection described above, there are two conditions for total reflection to occur. A first condition is that the light is directed from the optically denser medium to the optically thinner medium, and a second condition is that the incident angle is greater than or equal to the critical angle. Based on this, the refractive index of the light extraction layer 14 is larger than the refractive index of the material layer that is adjacent to the light extraction layer 14 and located on the side of the light extraction layer 14 proximate to the second electrode 132, so that the light may be directed from the optically thinner medium to the optical denser medium. Thus, it is possible to avoid the total reflection of the light during a propagation process thereof, thereby improving a light extraction rate.

In some embodiments, the refractive index of the light extraction layer 14 is greater than or equal to 1.8 for light with a wavelength of 620 nm. It has been found through research that, in the case where the refractive index of the light extraction layer 14 is greater than or equal to 1.8 for the light with the wavelength of 620 nm, light trapped in the light-emitting device 13 may be effectively coupled out, thereby further improving the luminous efficiency of the device.

For example, as shown in FIG. 1, the light extraction layer 14 may be in direct contact with the second electrode 132. In this case, the material layer adjacent to the light extraction layer 14 is the second electrode 132. The second electrode 132 may be made of a magnesium-silver alloy. For the light with the wavelength of 620 nm, a refractive index of the magnesium-silver alloy may be 1.27.

Of course, there may be other material layer disposed between the light extraction layer 14 and the second electrode 132. However, no matter what a function the material layer has, the refractive index of the light extraction layer 14 is greater than a refractive index of the material layer, thereby ensuring that the light emitted by the light-emitting device 13 can be coupled out.

In some embodiments, the material of the light extraction layer 14 is selected from any one of structures as shown in the following general formula (III):

(III)

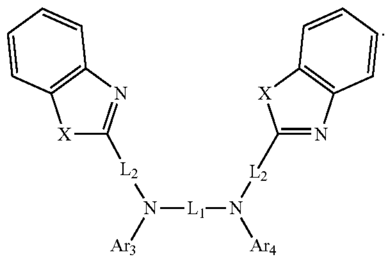

$Ar_3$ and $Ar_4$ are the same or different, and are each independently selected from any one of substituted or unsubstituted $C_6$-$C_{30}$ aryl and substituted or unsubstituted $C_2$-$C_{30}$ heteroaryl; X is selected from oxygen (O), sulfur (S), selenium (Se) or N—R, R being selected from hydrogen (H), substituted or unsubstituted $C_6$-$C_{30}$ aryl, substituted or unsubstituted $C_2$-$C_{30}$ heteroaryl, and substituted or unsubstituted $C_1$-$C_{30}$ alkyl; $L_1$ is selected from any one of a single bond, substituted or unsubstituted $C_6$-$C_{30}$ arylene and substituted or unsubstituted $C_2$-$C_{30}$ heteroarylene; and $L_2$ is selected from any one of a single bond, substituted or unsubstituted $C_6$-$C_{30}$ aryl, and substituted or unsubstituted $C_2$-$C_{30}$ heteroaryl.

In these embodiments, the material of the light extraction layer 14 has a unique structure of benzohetercyclic ring, which helps to increase the refractive index of the material.

In organic chemistry, the term "aryl" refers to any functional group or substituent derived from a simple aromatic ring, and is a general term for a monovalent radical derived from an aromatic hydrocarbon molecule by the removal of one hydrogen atom from a carbon atom of the aromatic nucleus. The simplest aryl is phenyl, which is derived to from benzene. Phenyl is monocyclic aryl. Of course, in addition to monocyclic aryl, aryl may also include polycyclic aryl and fused ring aryl.

The term "heteroaryl" is a general term for a monovalent radical derived from a heterocyclic aromatic hydrocarbon molecule by the removal of one hydrogen atom from a carbon atom of the nucleus. For example, pyridyl and furyl are each the monocyclic heteroaryl. Similar to aryl, in addition to monocyclic heteroaryl, heteroaryl may also include polycyclic heteroaryl and fused ring heteroaryl.

Correspondingly, the term "arylene" is a general term fora divalent radical derived from the aromatic hydrocarbon molecule by removal of one hydrogen atom from each of two carbon atoms of the nucleus. Similar to aryl, arylene may include monocyclic arylene (e.g., divalent phenyl), polycyclic arylene (e.g., divalent biphenylene), and fused ring arylene (e.g., divalent naphthyl, divalent fluorenyl, and divalent spirofluorenyl).

The term "heteroarylene" is a general term fora divalent radical derived from the heterocyclic aromatic hydrocarbon molecule by removal of one hydrogen atom from each of two carbon atoms of the nucleus. Similar to heteroaryl, heteroarylene may include monocyclic heteroarylene (e.g., bivalent pyridyl), polycyclic heteroarylene (e.g., bivalent bigeminal pyridyl), and fused ring heteroarylene (e.g., divalent benzofuranyl and divalent carbazolyl).

In a case where $L_1$ is a single bond, the structural formula of the general formula (III) may be expressed as the following formula (III-1).

(III_1)

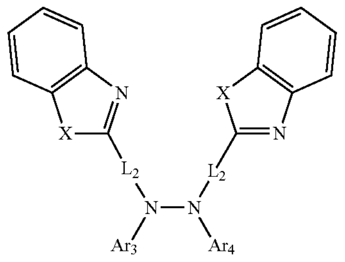

In a case where $L_2$ is a single bond, the structural formula of the general formula (III) may be expressed as the following formula (III_2):

(III_2)

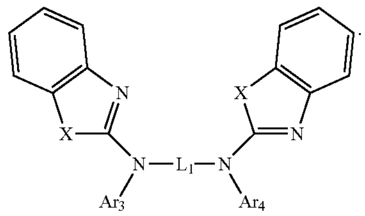

In some embodiments, the material of the light extraction layer 14 is selected from any one of structures as shown in the following structural formulas:

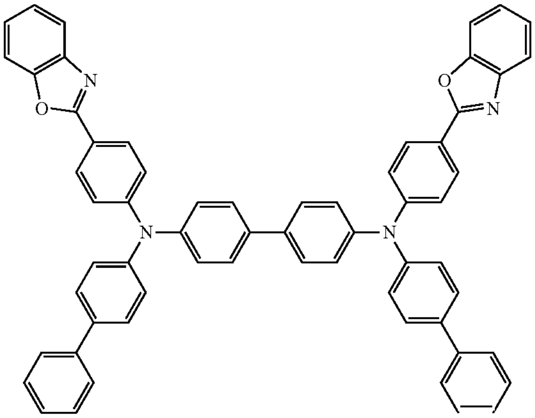

,

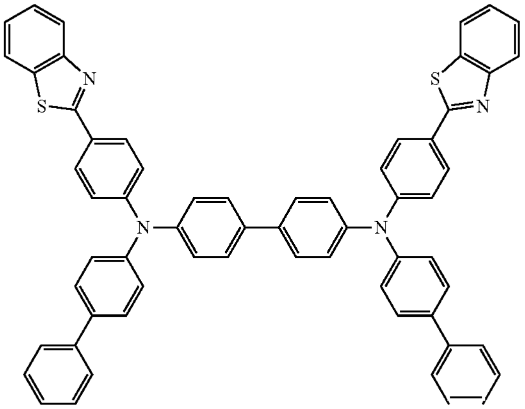

,

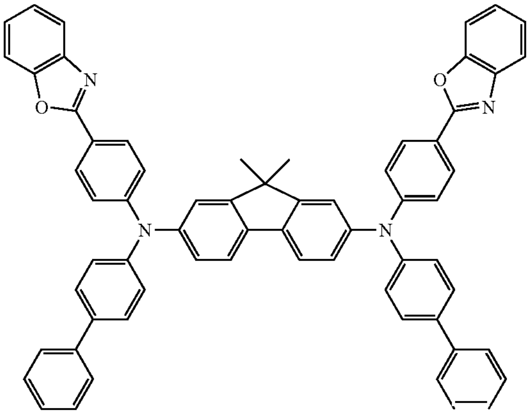

,

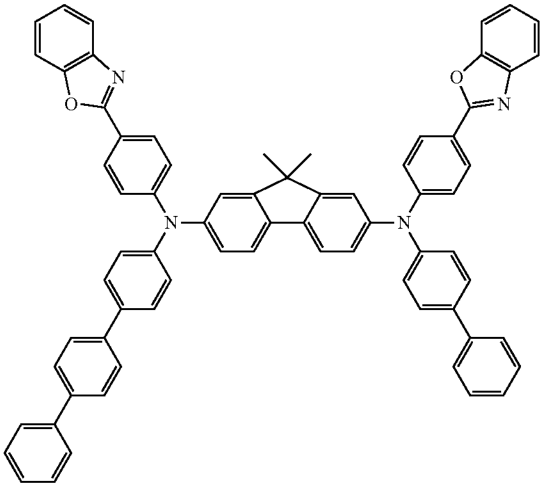

,

-continued

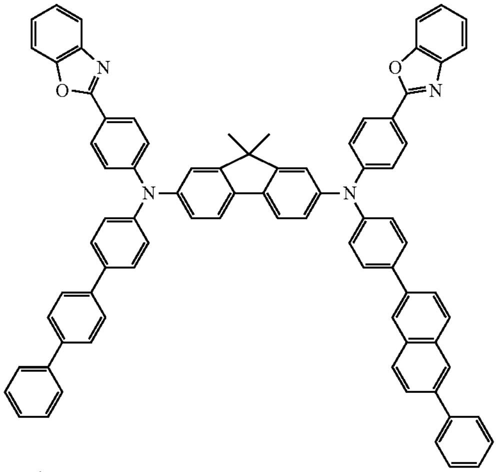

, and

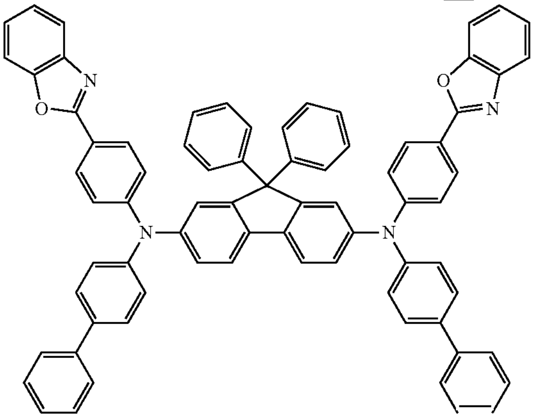

.

In order to objectively evaluate technical effects of the embodiments provided in the present disclosure, embodiments of the present disclosure will be exemplarily described in detail below through the following Comparative examples and Experimental examples.

It will be noted that, in the following Comparative examples and Experimental examples, light-emitting devices 13 each have a same structure including the anode, the hole injection layer (HIL) 134*b*, the hole transport layer (HTL) 134*c*, the electron blocking layer (EBL) 134*a*, the light-emitting layer 133, the electron transport layer (ETL) 135*b*, the electron injection layer (EIL) 135*a* and the cathode.

Hereinafter, manufacturing methods in Comparative examples and Experimental examples will be described by the following embodiments.

In some embodiments:

In step 1, both a p-dopant and a hole transport material (HTM) are evaporated through a vacuum evaporation manner, at a vacuum of $1\times10^{-5}$ Pa, on a glass substrate on which anodes (ITO) have been formed, so as to form a hole injection layer 134*b* with a thickness of 10 nm.

In step 2, HTM is then evaporated on the hole injection layer 134*b* to form a hole transport layer 134*c* with a thickness of 50 nm.

In step 3, a first compound is evaporated on the hole transport layer 134*c* to form an electron blocking layer 134*a* with a thickness of 5 nm.

In step 4, both the host material (BH) and the guest material (BD) are evaporated on the electron blocking layer 134*a* to form a light-emitting layer 133 with a thickness of nm. A molar ratio of the host material (BH) to the guest material (BD) in the light-emitting layer 133 is 97:3.

In step 5, both an electron transport material (ETM) and $LiQ_3$ are evaporated on the light-emitting layer 133 to form an electron transport layer **135*b*** with a thickness of 30 nm.

In step 6, LiF is evaporated on the electron transport layer **135*b* to form an electron injection layer 135*a*** with a thickness of 1 nm.

In step 7, both an Mg metal and an Ag metal (a mass ratio of Mg to Ag being 8:2) are evaporated on the electron injection layer **135*a*** to form a cathode layer with a thickness of 15 nm.

In step 8, a second compound is evaporated on the cathode layer to form a light extraction layer 14 with a thickness of 50 nm.

The p-dopant, HTM, host material (BH) and ETM in Comparative examples and Experimental examples are each the same, and structural formulas of these materials are as shown below:

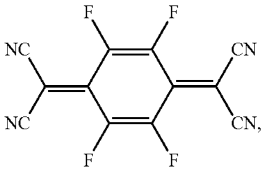

(p-dopant)

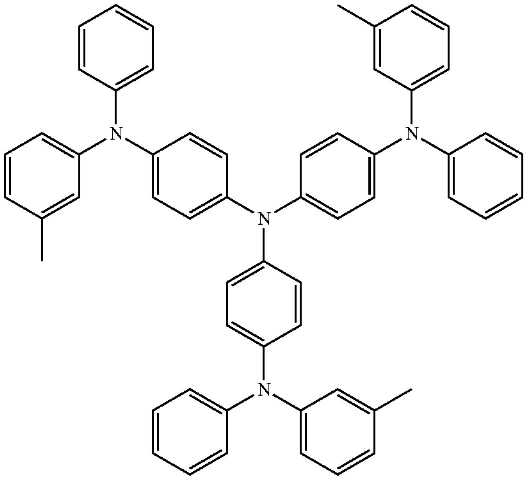

(HTM)

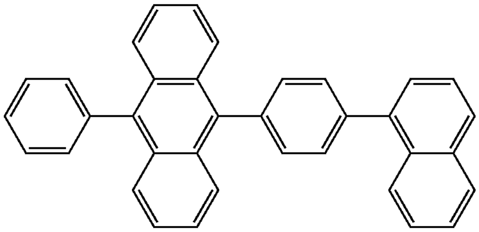

, and

-continued

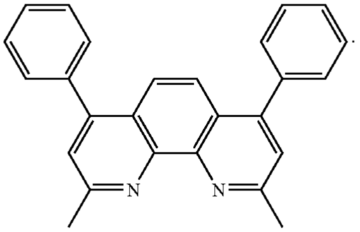

(ETM)

For Comparative examples and Experimental examples, the differences are that: in Comparative example 1 and Comparative example 2, structural formulas of the first compounds are respectively shown as the following Compound 1_1 and Compound 1_2, structural formulas of BD are each shown as the following Compound BD_1, and structural formulas of the second compound 2 are each shown as the following Compound 2_1.

In Experimental examples 1 to 5, structural formulas of the first compounds are each selected from the following Compound 1_3 and Compound 1_4, structural formulas of BD are each selected from the following Compound BD_1 and Compound BD_2, and structural formulas of the second compounds are each selected from the following to Compound 2_1 and Compound 2_2.

(Compound 1_1)

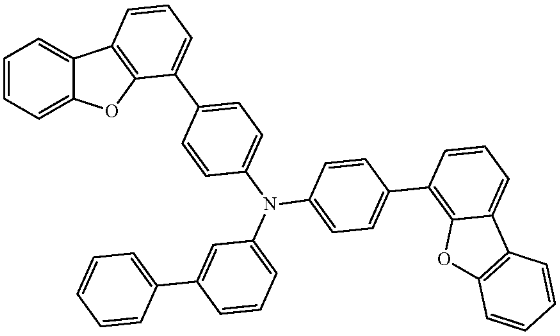

(Compound 1_2)

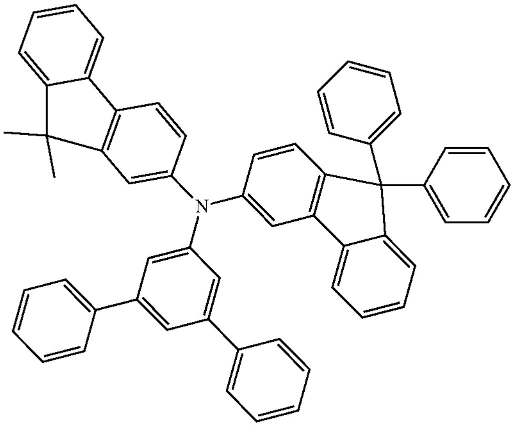

(BH)

-continued (Compound 1_3)

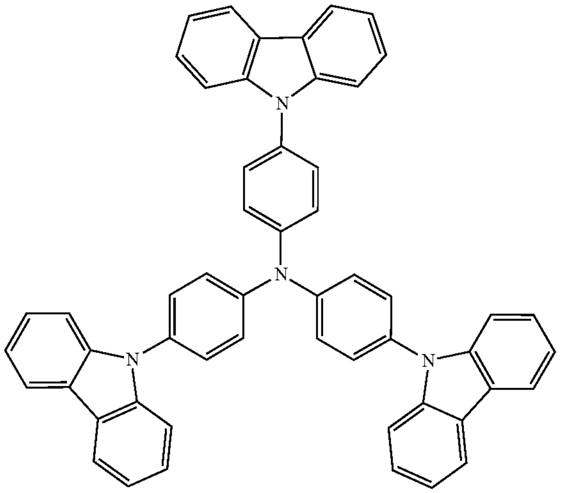

(BD_1)

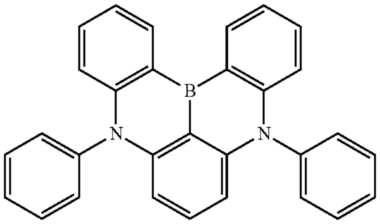

(Compound 2_1)

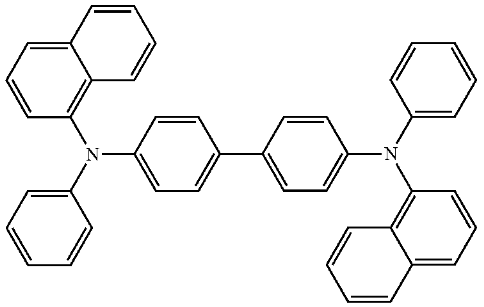

(Compound 1_4)

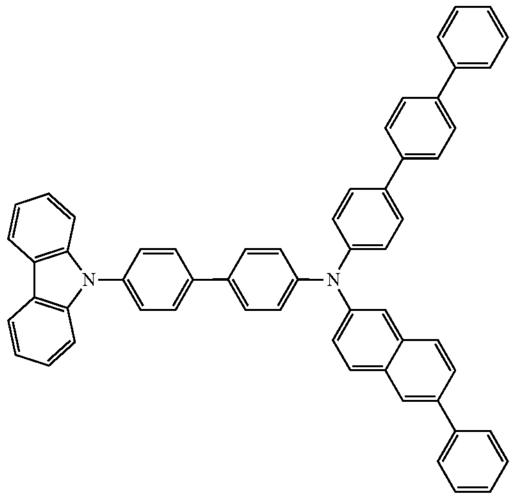

-continued (BD_2)

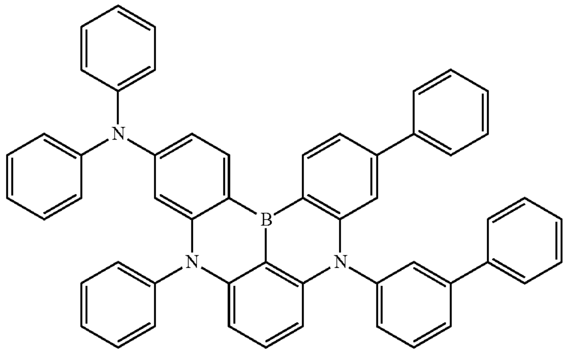

(Compound 2_2)

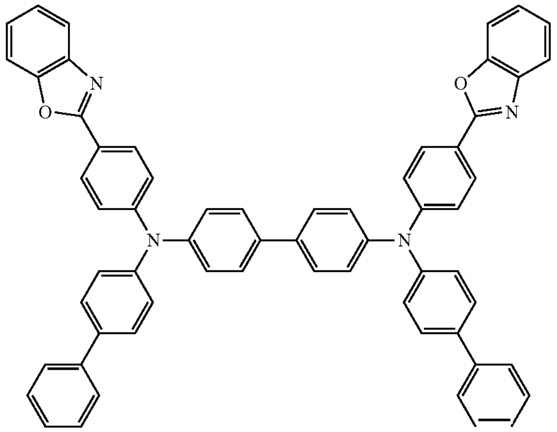

LUMO energy levels of the Compound 1_1, Compound 1_2, Compound 1_3, and Compound 1_4, differences between the LUMO energy level of BH and each of the LUMO energy levels, and hole mobilities of the Compound 1_1, Compound 1_2 and Compound 1_3 are shown in Table 1 below. Molecular ellipticities of Compound BD_1 and Compound BD_2 are shown in Table 2 below. Refractive indices of Compound 2_1 and Compound 2_2 are shown in Table 3 below.

TABLE 1

| First compound | LUMO energy level | $LUMO_{EB}$-$LUMO_{BH}$ | hole mobility |
|---|---|---|---|
| Compound 1_1 | −2.60 | 0.20 | $2.2 \times 10^{-4}$ $cm^2V^{-1}s^{-1}$ |
| Compound 1_2 | −2.28 | 0.52 | $3.9 \times 10^{-10}$ $cm^2V^{-1}s^{-1}$ |
| Compound 1_3 | −2.43 | 0.37 | $4.2 \times 10^{-8}$ $cm^2V^{-1}s^{-1}$ |
| Compound 1_4 | −2.36 | 0.44 | $1.8 \times 10^{-7}$ $cm^2V^{-1}s^{-1}$ |

TABLE 2

| BD | Molecular ellipticity |
|---|---|
| BD_1 | 1.53 |
| BD_2 | 1.85 |

TABLE 3

| Second compound | Refractive index n |
|---|---|
| Compound 2_1 | 1.83 |
| Compound 2_2 | 1.93 |

A combination of materials of the first compound, the guest material BD and the second compound selected in each of Comparative example 1, Comparative example 2 and Experimental examples 1 to 5, and a driving voltage, a current efficiency and a service life of the device that correspond to each combination of the materials are shown in Table 4 below.

TABLE 4

| Name | Combination of materials | | | Driving voltage | Current efficiency | Service life (LT95@ 1000 nit) |
|---|---|---|---|---|---|---|
| Comparative Example 1 | Compound 1_1 | BD_1 | Compound 2_1 | 100% | 100% | 100% |
| Comparative Example 2 | Compound 1_2 | BD_1 | Compound 2_1 | 83% | 102% | 110% |
| Experimental example 1 | Compound 1_3 | BD_1 | Compound 2_1 | 83% | 105% | 111% |
| Experimental example 2 | Compound 1_4 | BD_1 | Compound 2_1 | 81% | 113% | 143% |
| Experimental example 3 | Compound 1_3 | BD_1 | Compound 2_2 | 84% | 111% | 112% |
| Experimental example 4 | Compound 1_3 | BD_2 | Compound 2_1 | 82% | 117% | 140% |
| Experimental example 5 | Compound 1_4 | BD_2 | Compound 2_2 | 80% | 121% | 152% |

Referring to Table 1 and Table 2, it can be seen from Comparative example 1 and Comparative example 2 that, in the related art, in a case where the LUMO energy level of the material of the electron blocking layer 134*a* is relatively high, the hole mobility is generally low; in a case where the hole mobility of the material of the electron blocking layer 134*a* is relatively high, it is difficult for the LUMO energy level to meet the requirement of blocking electrons. For example, although the difference between the LUMO energy level of Compound 1_2 and the LUMO energy level of the host material (BH) may be greater than 0.3 eV, the hole mobility is only $3.9\times10^{-10}$ $cm^2V^{-1}s^{-1}$; and although Compound 1_1 has a relatively high hole mobility, the difference between the LUMO energy level thereof and the LUMO energy level of the host material BH is less than 0.3 eV (as shown in Table 1, the difference between the LUMO energy level of the compound 1_1 and the LUMO energy level of the host material BH (i.e., $LUMO_{EB}-LUMO_{BH}$) is 0.20). Therefore, it is difficult to enable all of the driving voltage, the current efficiency and the service life of the device to meet the application requirements. Moreover, the current efficiency of the device is not only related to the LUMO energy level and the light-emitting region, but also related to the HOMO energy level of each material. Therefore, there isn't great difference in the current efficiencies of Comparative example 1 and Comparative example 2.

Based on this, in the embodiments of the present disclosure, the electron blocking material having a relatively high LUMO energy level and a relatively high hole mobility is selected, which may reduce the driving voltage, improve the current efficiency, and improve the service life of the device. In addition, comparing Experimental example 1 with Experimental example 2, it can be seen that, with the increase of LUMO energy level and hole mobility, the driving voltage tends to decrease, and the current efficiency and the service life of the device tend to increase. Comparing Experimental example 1, Experimental example 3, Experimental example 4 and Experimental example 5, it can be known that, as the molecular ellipticity of BD increases, the driving voltage decreases, and both the current efficiency and the service life of the device increase; as the refractive index of the light extraction layer increases, the driving voltage decreases, and the current efficiency and the service life of the device increase. Compared with Experimental examples 1 to 4, Experimental example 5 may greatly improve the efficiency and stability of the device, and has a good application prospect.

In summary, the material of the electron blocking layer 134*a* having a relatively high LUMO energy level is selected, which may effectively block the electrons from diffusing to the hole transport layer 134*c*, prevent a C—N bond in the hole transport layer 134*c* form breaking, and reduce the quenching of electrons, so as to confine the excitons in the light-emitting region. In addition, the hole mobility of the material of the electron blocking layer 134*a* is properly set to enable the exciton recombination zone to move to the center of the light-emitting layer 133, which may greatly improve the efficiency and service life of the device. Based on this, a material having a structure with a relatively high quantum efficiency and a high molecular ellipticity is selected as the guest material (BD), which is beneficial to the extraction of light, thereby further improving the luminous efficiency of the device. Further, a light extraction material with a high refractive index is selected, which may make the light trapped in the device be coupled out, so as to maximize the light extraction efficiency, thereby further improving the luminous efficiency of the device.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the scope of the present disclosure shall be subject to the protection scope of the claims.

What is claimed is:

1. A light-emitting device, comprising:

a first electrode and a second electrode that are arranged in sequence; and a plurality of functional layers disposed between the first electrode and the second electrode;

wherein the plurality of functional layers include: a light-emitting layer, at least two material layers each having a hole transport function and located between the light-emitting layer and the first electrode, and at least one material layer having an electron transport function and located between the light-emitting layer and the second electrode; the at least two material layers each having the hole transport function include an electron blocking layer; a material of the light-emitting layer includes a host material and a guest material;

a difference between a lowest unoccupied molecular orbital (LUMO) energy level of a material of the electron blocking layer and an LUMO energy level of the host material is greater than or equal to 0.3 eV; and under a same test condition, a ratio of an order of magnitude of a hole mobility of the material of the electron blocking layer to an order of magnitude of an electron mobility of a material of the at least one material layer having the electron transport function is greater than or equal to 1;

the guest material is selected from any one of compounds whose molecular ellipticities are greater than 1.8;

under a test condition of an electric field intensity of 5000 $V^{1/2}/m^{1/2}$, the electron mobility of the material of the at least one material layer having the electron transport function is in a range of $10^{-8}$ $cm^2V^{-1}$ s to $10^{-7}$ $cm^2V^{-1}s^{-1}$, inclusive; and the hole mobility of the material of the electron blocking layer is in a range of $10^{-8}$ $cm^2V^{-1}s^{-1}$ to $10^{-6}$ $cm^2V^{-1}s^{-1}$, inclusive.

2. The light-emitting device according to claim 1, wherein the material of the electron blocking layer is selected from any one of structures as shown in a following general formula (I):

(I)

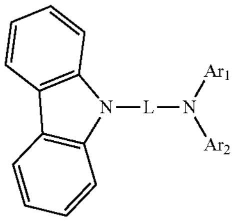

$Ar_1$ and $Ar_2$ are same or different, and are each independently selected from any one of $C_6$-$C_{30}$ aryl, and $C_2$-$C_{30}$ heteroaryl; and L is selected from any one of a single bond, $C_6$-$C_{30}$ arylene, and $C_2$-$C_{30}$ heteroarylene.

3. The light-emitting device according to claim 1, wherein the material of the electron blocking layer is selected from any one of structures as shown in following structural formulas:

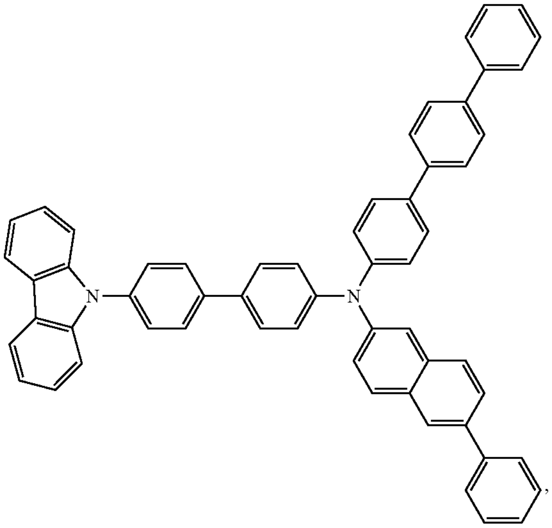

,

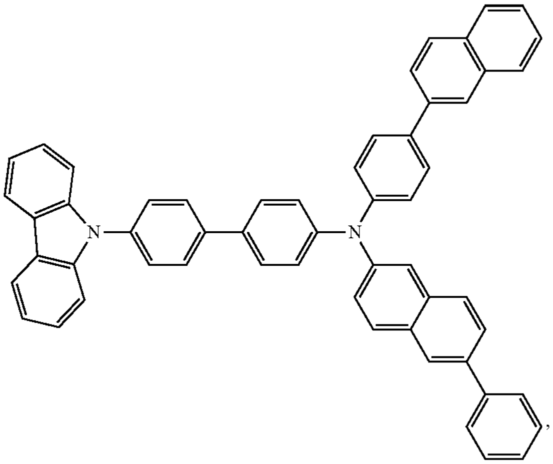

,

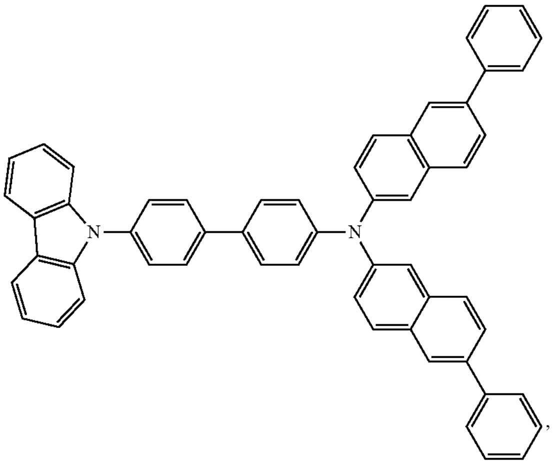

,

-continued

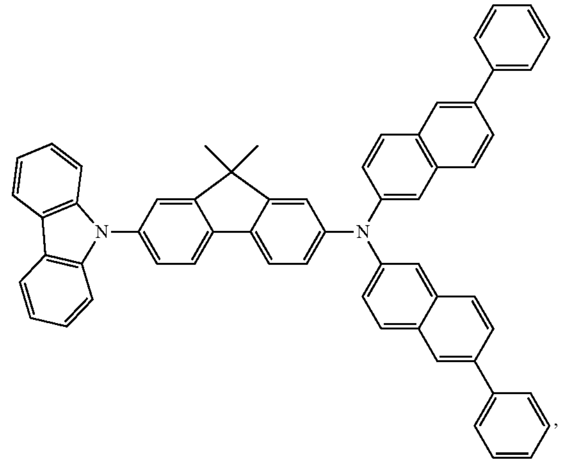

,

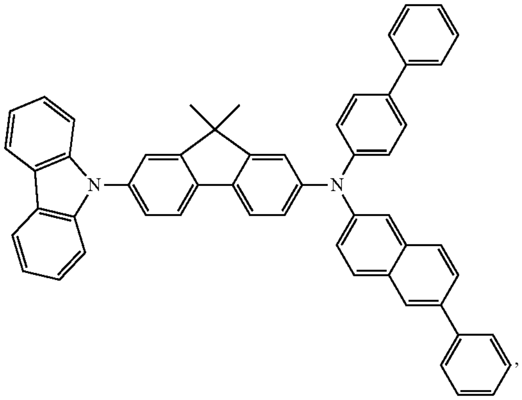

, and

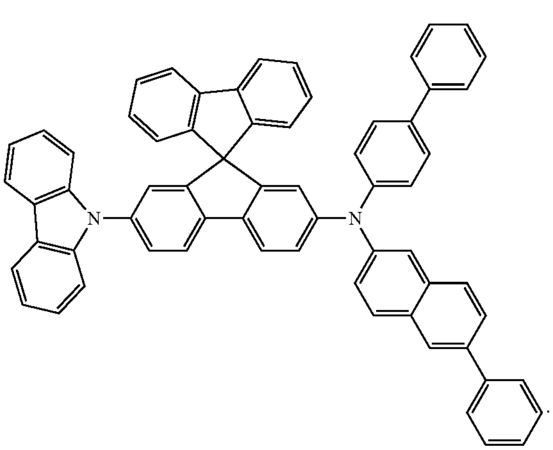

.

4. The light-emitting device according to claim 1, wherein the guest material is selected from any one of structures as shown in a following general formula (II):

(II)

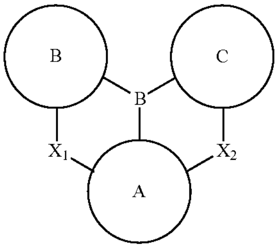

A is selected from any one of $C_6$-$C_{30}$ aryl, and $C_2$-$C_{30}$ heteroaryl;

B and C are each independently selected from any one of $C_6$-$C_{30}$ aryl, $C_2$-$C_{30}$ heteroaryl and structures as shown in following structural formulas:

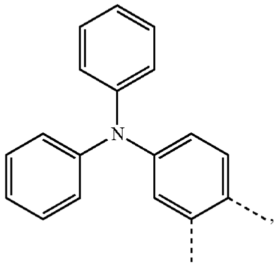

,

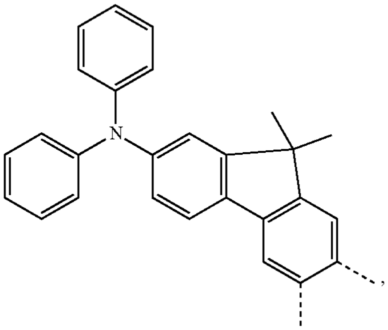

,

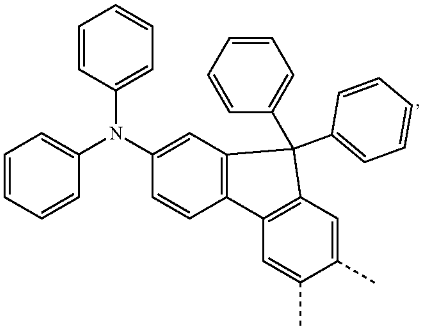

,

-continued

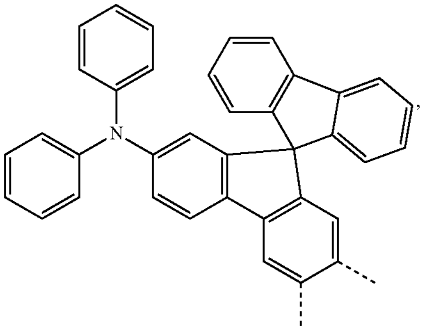

and

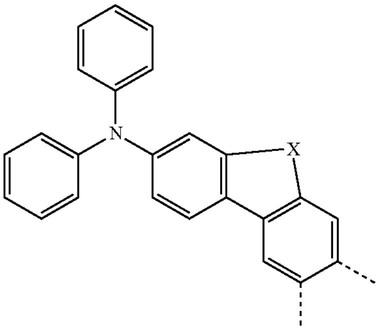

X is selected from O, S, Se or N—R, R being selected from any one of H, $C_6$-$C_{30}$ aryl, $C_2$-$C_{30}$ heteroaryl, and $C_1$-$C_{30}$ alkyl;

$X_1$ and $X_2$ are same or different, and are each independently selected from N(R), R being selected from any one of hydrogen, $C_6$-$C_{30}$ aryl, $C_2$-$C_{30}$ heteroaryl, and $C_1$-$C_{30}$ alkyl.

5. The light-emitting device according to claim 4, wherein

A is selected from any one of phenylene, and biphenylene;

B and C are each independently selected from any one of phenylene, biphenylene and structures as shown in following structural formulas:

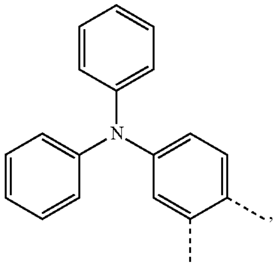

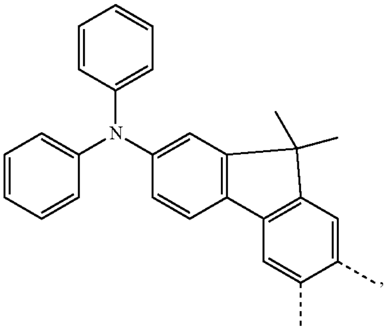

-continued

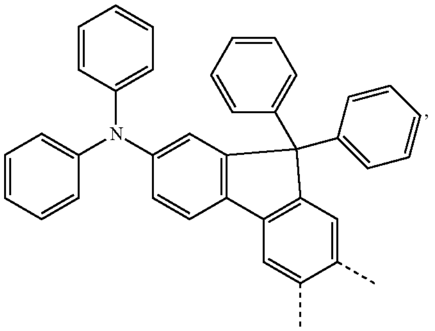

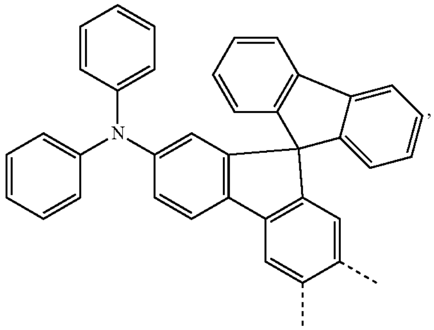

and

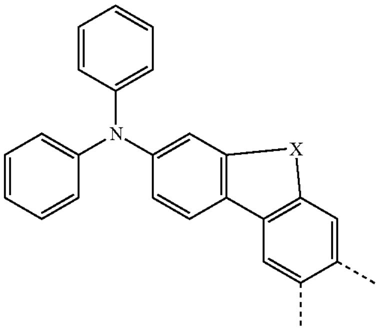

X is selected from O, S, Se or N—R, R being selected from any one of H, $C_6$-$C_{30}$ aryl, $C_2$-$C_{30}$ heteroaryl, and $C_1$-$C_{30}$ alkyl.

6. The light-emitting device according to claim 1, wherein the guest material is selected from any one of structures as shown in following structural formulas:

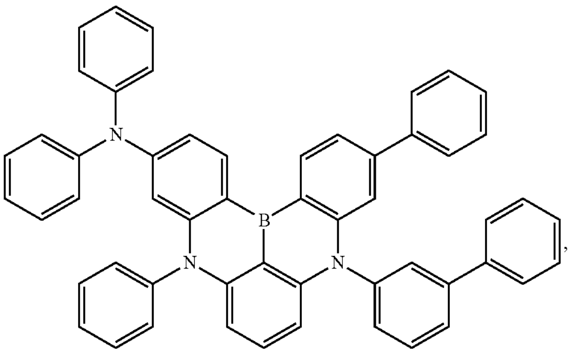

-continued

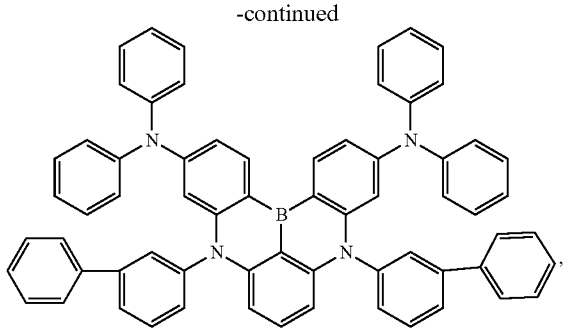

,

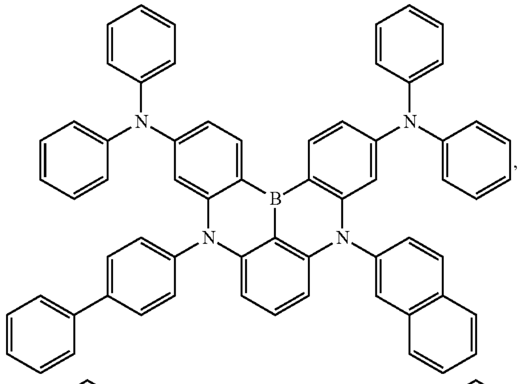

, and

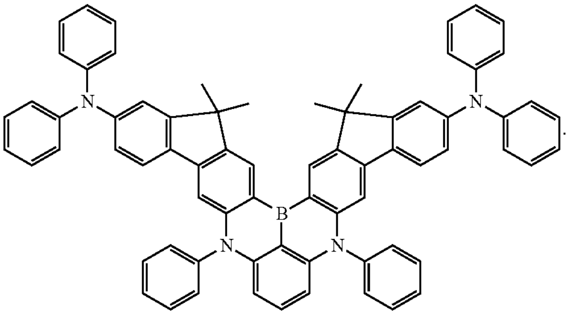

.

7. A light-emitting substrate, comprising:

a substrate; and a plurality of light-emitting devices disposed on the substrate;

wherein at least one of the plurality of the light-emitting devices is the light-emitting device according to claim 1.

8. The light-emitting substrate according to claim 7, wherein the first electrode is closer to the substrate than the second electrode, and the second electrode is capable of transmitting light;

the light-emitting substrate further comprises a light extraction layer disposed on a side of the second electrode away from the substrate; and a refractive index of the light extraction layer is greater than a refractive index of a material layer that is adjacent to the light extraction layer and located on a side of the light extraction layer proximate to the second electrode when said material layer is present.

9. The light-emitting substrate according to claim 8, wherein for light with a wavelength of 620 nm, the refractive index of the light extraction layer is greater than or equal to 1.8.

10. The light-emitting substrate according to claim 8, wherein a material of the light extraction layer is selected from any one of structures as shown in following general formula (III):

(III)

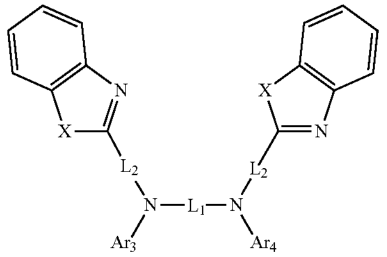

$Ar_3$, $Ar_4$ are same or different, and are each independently selected from $C_6$-$C_{30}$ aryl and $C_2$-$C_{30}$ heteroaryl; X is selected from O, S, Se or N—R, R being selected from any one of H, $C_6$-$C_{30}$ aryl, $C_2$-$C_{30}$ heteroaryl, and $C_1$-$C_{30}$ alkyl; $L_1$ is selected from any one of a single bond, $C_6$-$C_{30}$ arylene, and $C_2$-$C_{30}$ heteroarylene; and $L_2$ is selected from any one of a single bond, $C_6$-$C_{30}$ aryl, and $C_2$-$C_{30}$ heteroaryl.

11. The light-emitting substrate according to claim 7, wherein the material of the light extraction layer is selected from any one of structures as shown in following structural formulas:

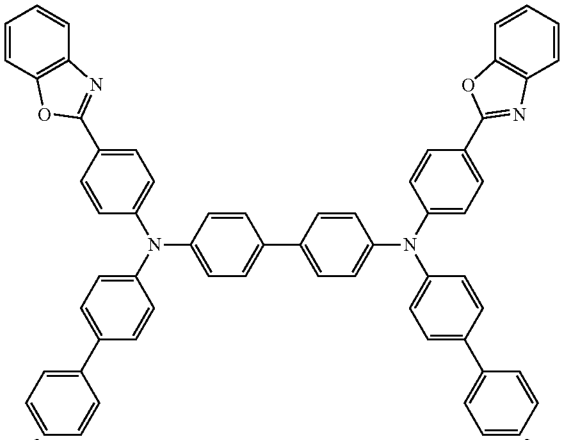

,

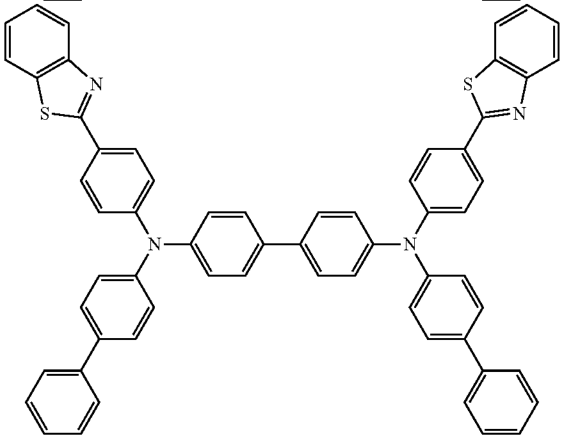

,

-continued

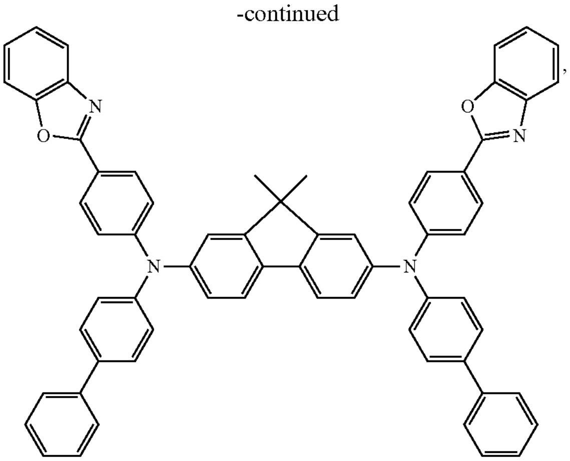

,

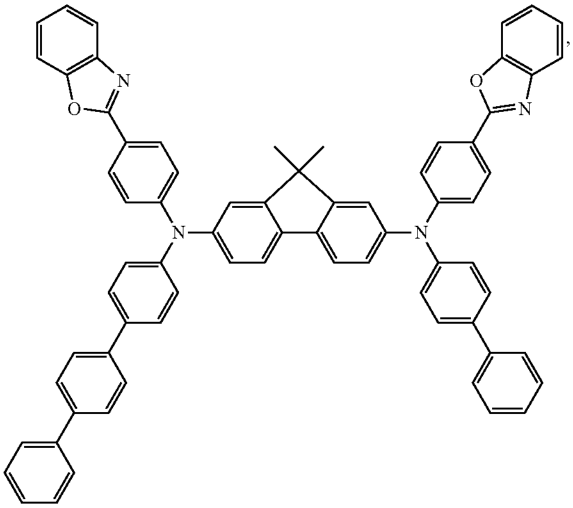

,

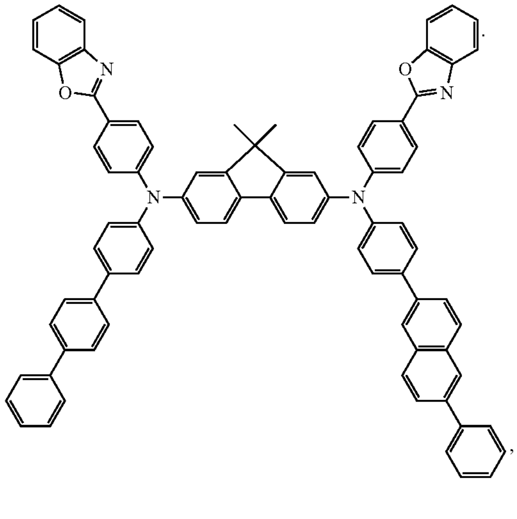

, and

-continued

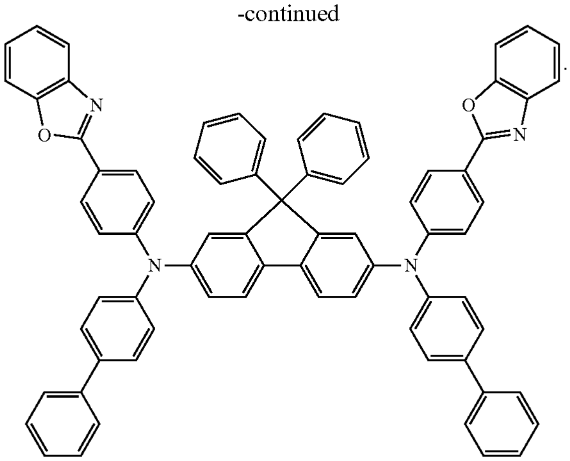

.

12. A light-emitting apparatus, comprising the light-emitting substrate according to claim 7.

13. The light-emitting device according to claim 1, wherein under a test condition of an electric field intensity of 5000 $V^{1/2}/m^{1/2}$, a hole mobility of each of materials of the at least two material layers each having the hole transport function is in a range of $10^{-5}$ $cm^2V_{-1}s^{-1}$ to $10^{-4}$ $cm^2V^{-1}s^{-1}$, inclusive.

14. The light-emitting substrate according to claim 7, wherein the first electrode is closer to the substrate than the second electrode, and the second electrode is capable of transmitting light;

the light-emitting substrate further comprises a light extraction layer disposed on a side of the second electrode away from the substrate; and the second electrode is in direct contact with the light extraction layer, and a refractive index of the light extraction layer is greater than a refractive index of the second electrode.

15. The light-emitting substrate according to claim 14, wherein the second electrode is made of a magnesium-silver alloy.

16. The light-emitting substrate according to claim 14, wherein for light with a wavelength of 620 nm, the refractive index of the light extraction layer is greater than or equal to 1.8.

17. The light-emitting device according to claim 4, wherein the material of the electron blocking layer is selected from any one of structures as shown in a following general formula (I):

(I)

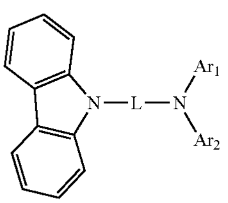

$Ar_1$ and $Ar_2$ are same or different, and are each independently selected from any one of $C_6$-$C_{30}$ aryl, and $C_2$-$C_{30}$ heteroaryl; and L is selected from any one of a single bond, $C_6$-$C_{30}$ arylene, and $C_2$-$C_{30}$ heteroarylene.

18. The light-emitting device according to claim 3, wherein the guest material is selected from any one of structures as shown in a following general formula (II):

(II)

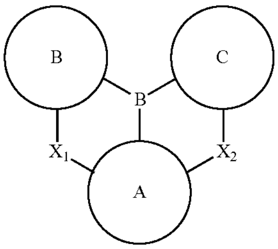

A is selected from any one of $C_6$-$C_{30}$ aryl, and $C_2$-$C_{30}$ heteroaryl;

B and C are each independently selected from any one of $C_6$-$C_{30}$ aryl, $C_2$-$C_{30}$ heteroaryl and structures as shown in following structural formulas:

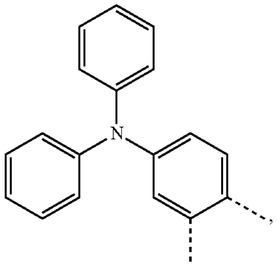

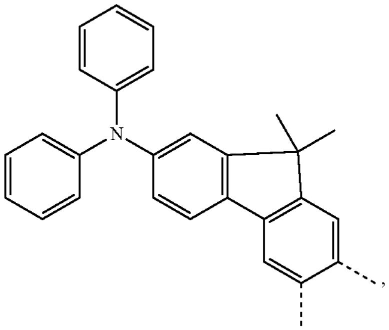

-continued

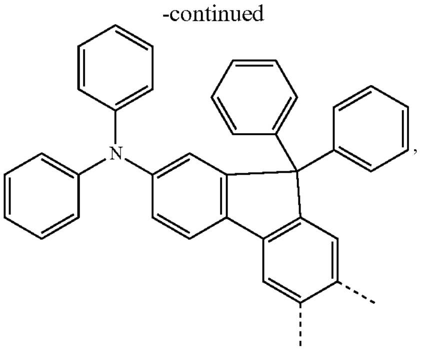

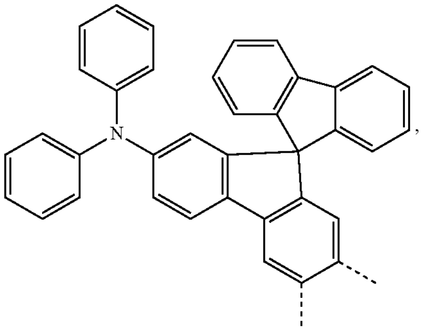

and

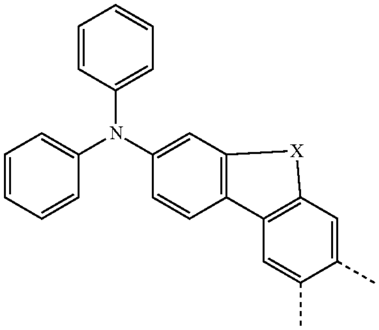

X is selected from O, S, Se or N—R, R being selected from any one of H, $C_6$-$C_{30}$ aryl, $C_2$-$C_{30}$ heteroaryl, and $C_1$-$C_{30}$ alkyl:

$X_1$ and $X_2$ are same or different, and are each independently selected from N(R), R being selected from any one of hydrogen, $C_6$-$C_{30}$ aryl, $C_2$-$C_{30}$ heteroaryl, and $C_1$-$C_{30}$ alkyl.

* * * * *